(12) United States Patent
Lee et al.

(10) Patent No.: US 10,312,196 B2
(45) Date of Patent: Jun. 4, 2019

(54) SEMICONDUCTOR PACKAGES INCLUDING INDICATORS FOR EVALUATING A DISTANCE AND METHODS OF CALCULATING THE DISTANCE

(71) Applicant: SK hynix Inc., Icheon-si, Gyeonggi-do (KR)

(72) Inventors: Sukwon Lee, Icheon-si (KR); Bok Gyu Min, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/945,989

(22) Filed: Apr. 5, 2018

(65) Prior Publication Data

US 2019/0019761 A1    Jan. 17, 2019

(30) Foreign Application Priority Data

Jul. 17, 2017    (KR) .................. 10-2017-0090241

(51) Int. Cl.
| | |
|---|---|
| H01L 23/52 | (2006.01) |
| H01L 23/544 | (2006.01) |
| H01L 23/31 | (2006.01) |
| H01L 23/498 | (2006.01) |
| H01L 25/065 | (2006.01) |
| H01L 23/00 | (2006.01) |
| H01L 21/78 | (2006.01) |

(52) U.S. Cl.
CPC ........ *H01L 23/544* (2013.01); *H01L 23/3128* (2013.01); *H01L 23/49838* (2013.01); *H01L 25/0657* (2013.01); *H01L 21/78* (2013.01); *H01L 24/97* (2013.01); *H01L 2223/5442* (2013.01); *H01L 2223/54486* (2013.01); *H01L 2225/06548* (2013.01); *H01L 2225/06562* (2013.01); *H01L 2225/06586* (2013.01)

(58) Field of Classification Search
CPC ............... H01L 23/544; H01L 23/3128; H01L 23/49838; H01L 25/0657
USPC .......................................................... 257/773
See application file for complete search history.

(56) References Cited

U.S. PATENT DOCUMENTS

| | | | | |
|---|---|---|---|---|
| 5,729,437 | A * | 3/1998 | Hashimoto | ......... H01L 23/3121 174/260 |
| 8,022,511 | B2 * | 9/2011 | Chiu | ...................... H01L 21/568 257/659 |
| 8,410,584 | B2 * | 4/2013 | An | ....................... H01L 23/3121 257/660 |
| 8,937,370 | B2 * | 1/2015 | Song | ..................... H01L 23/552 257/659 |
| 2002/0114507 | A1 | 8/2002 | Lynch et al. | |
| 2011/0175222 | A1 * | 7/2011 | Kim | ........................ H01L 23/16 257/738 |

\* cited by examiner

*Primary Examiner* — Luan C Thai
(74) *Attorney, Agent, or Firm* — William Park & Associates Ltd.

(57) ABSTRACT

A semiconductor package may include a package substrate to which a first semiconductor chip is attached, an encapsulant covering the first semiconductor chip, and an indicator disposed within the semiconductor package. A side surface of the indicator is exposed at a side surface of the semiconductor package, and a width of a vertical section of the indicator parallel with the exposed side surface of the indicator varies as the vertical section of the indicator becomes farther from the side surface of the semiconductor package.

13 Claims, 18 Drawing Sheets

SEMICONDUCTOR PACKAGES INCLUDING INDICATORS FOR EVALUATING A DISTANCE AND METHODS OF CALCULATING THE DISTANCE

CROSS-REFERENCE TO RELATED APPLICATIONS

The present application claims priority under 35 U.S.C 119(a) to Korean Application No. 10-2017-0090241, filed on Jul. 17, 2017, which is incorporated herein by references in its entirety.

BACKGROUND

1. Technical Field

Embodiments of the present disclosure may generally relate to semiconductor package technologies and, more particularly, to semiconductor packages including indicators for evaluating a distance and methods of calculating the distance.

2. Related Art

As electronic devices shrink, a size of the semiconductor packages employed in the electronic devices are also reduced. In such cases, a distance between a side surface of a semiconductor chip embedded in a semiconductor package and a side surface of the semiconductor package may also be reduced. Accordingly, it may be important to stably maintain a distance between the semiconductor chip disposed in the semiconductor package and a side surface of the semiconductor package to prevent the reliability of the semiconductor package from degrading. That is, a technique for measuring and monitoring a distance between the semiconductor chip disposed in the semiconductor package and a side surface of the semiconductor package may be required to ensure a reliable semiconductor package.

In general, it may be difficult to directly observe the semiconductor chips disposed in the semiconductor packages after the semiconductor packages are fabricated. Thus, a destructive analysis technique or a non-destructive analysis technique using an X-ray has been used to obtain information on positions of the semiconductor chips disposed in the semiconductor packages. These techniques take a long time and are complicated processes for obtaining information on positions of the semiconductor chips disposed in the semiconductor packages. Accordingly, it is beneficial to develop a technique for accurately measuring, with simplicity, a distance between the semiconductor chip disposed in the semiconductor package and a side surface of the semiconductor package without using the destructive analysis technique or the non-destructive analysis technique with an X-ray.

SUMMARY

According to an embodiment, there may be provided a semiconductor package. The semiconductor package may include a package substrate to which a first semiconductor chip is attached, an encapsulant covering the first semiconductor chip, and an indicator disposed within the semiconductor package. A side surface of the indicator may be exposed at a side surface of the semiconductor package, and a width of a vertical section of the indicator parallel with the exposed side surface of the indicator may vary as the vertical section of the indicator becomes farther from the side surface of the semiconductor package.

According to an embodiment, there is provided a semiconductor package. The semiconductor package may include a package substrate to which a first semiconductor chip is attached, an encapsulant covering the first semiconductor chip, and an indicator including an array of indicating blocks disposed within the semiconductor package. At least one of the indicating blocks may be exposed at a side surface of the semiconductor package, and the number of the indicating blocks exposed by a vertical section of the indicator parallel with the side surface of the semiconductor package may vary as the vertical section of the indicator becomes farther from the side surface of the semiconductor package.

According to an embodiment, there is provided a semiconductor package. The semiconductor package may include at least two or more package regions each including a semiconductor package, the package regions coupled to one another through a cutting region. The semiconductor package may include an indicator disposed within each of the package regions and semiconductor packages, and including a vertical section having a width, the vertical section of the indicator being substantially parallel with the cutting region. Each semiconductor package may include an encapsulant formed over a package substrate. Each semiconductor package may include a first semiconductor chip attached to the package substrate and the encapsulant covering the first semiconductor chip. The width of the vertical section may vary as the vertical section of the indicator becomes farther from the cutting region.

According to an embodiment, there is provided a method of calculating a distance between a side surface of a semiconductor package and a side surface of a first semiconductor chip, the semiconductor package including a first semiconductor chip attached to a package substrate and an encapsulant covering the first semiconductor chip. The method may include: exposing a side surface of an indicator located at the side surface of the semiconductor package; measuring a length of the exposed side surface of the indicator; calculating a first distance between the exposed side surface of the indicator and a first vertex of the indicator using an internal angle of the first vertex and a width of the exposed side surface of the indicator; and adding a predetermined distance between the first vertex and the first semiconductor chip to the first distance.

According to an embodiment, there is provided a method of calculating a range of distance between a side surface of a semiconductor package and a side surface of a first semiconductor chip, the semiconductor package including a first semiconductor chip attached to a package substrate and an encapsulant covering the first semiconductor chip. The method may include: exposing a side surface of an indicator located at the side surface of the semiconductor package; counting the number of indicating blocks exposed at the exposed side surface of the indicator to determine which column of indicating blocks are exposed at the exposed side surface of the indicator; and calculating the range of distance between the side surface of the semiconductor package and the side surface of the first semiconductor chip based on the column of indicating blocks that are exposed at the exposed side surface of the indicator.

BRIEF DESCRIPTION OF THE DRAWINGS

Various embodiments of the present disclosure will become more apparent in view of the attached drawings and accompanying detailed description, in which.

DETAILED DESCRIPTION

Figure 1:
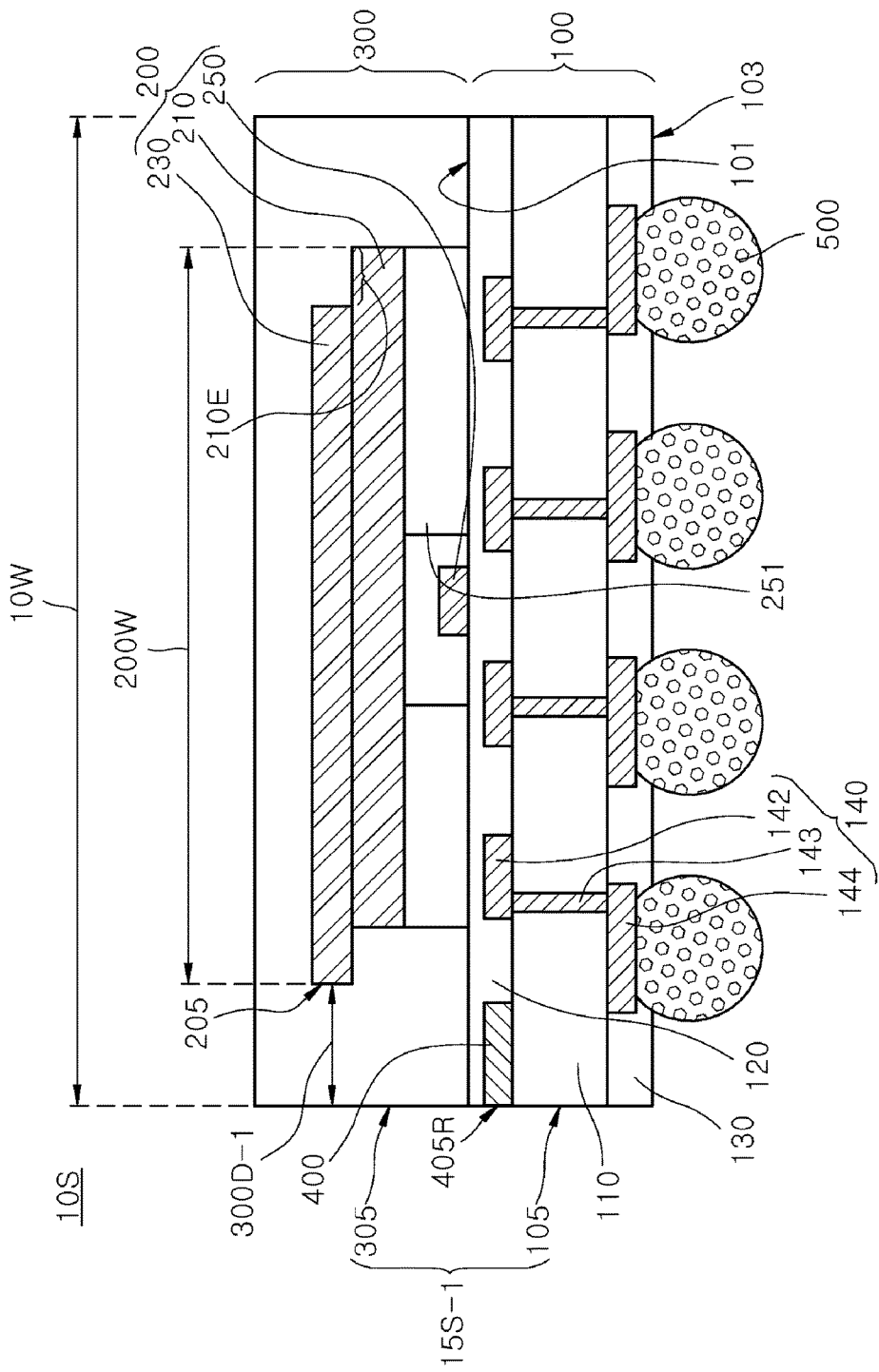
FIG. 1 is a cross-sectional view illustrating a semiconductor package according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms first, second, third etc. may be used herein to describe various elements, these elements should not be limited by these terms. These terms are only used to distinguish one element from another element, but not used to define only the element itself or to mean a particular sequence.

A semiconductor package may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems.

Same reference numerals refer to same elements throughout the specification. Thus, even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Figure 2:
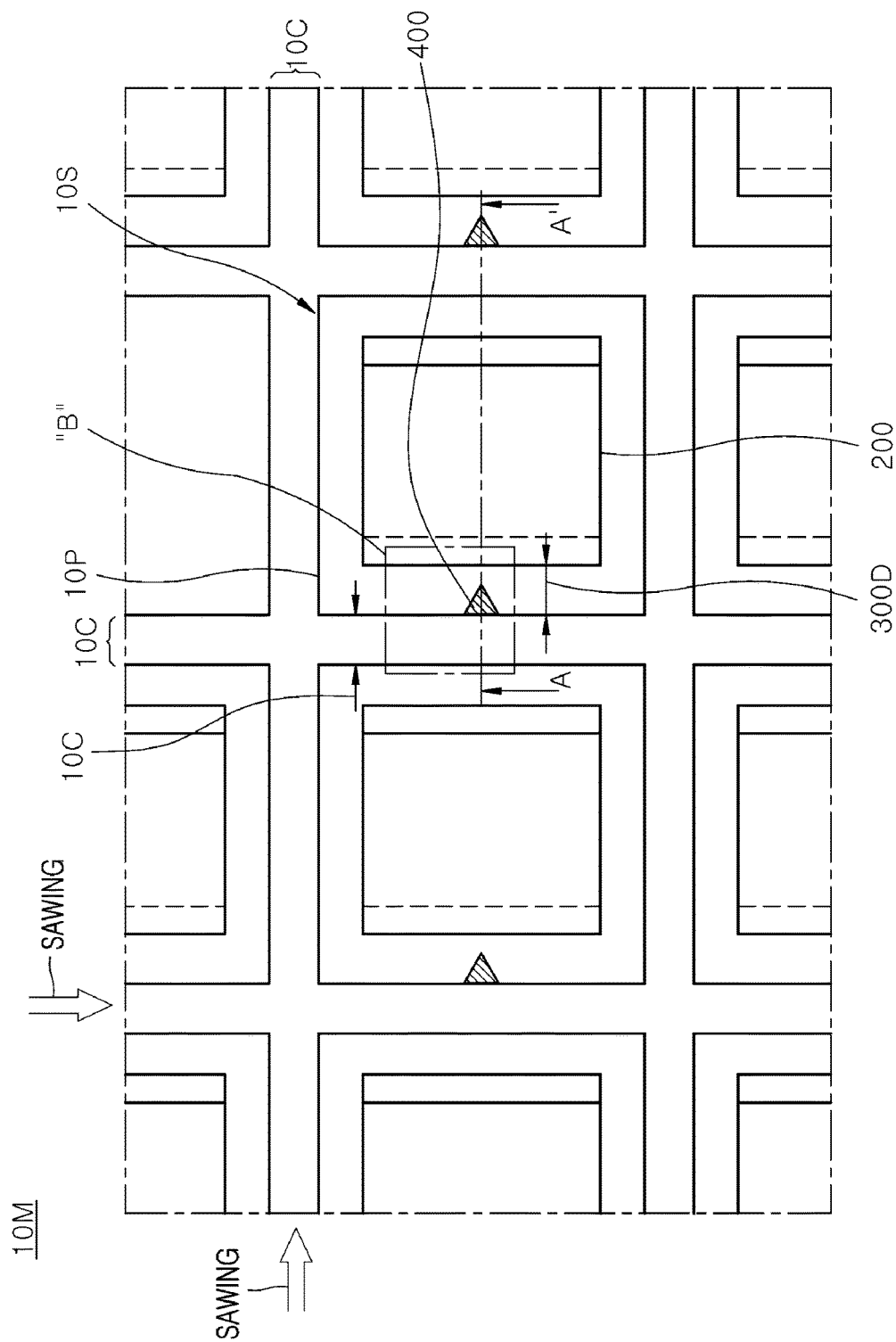
FIG. 2 is a plan view illustrating a semiconductor package array including a plurality of semiconductor packages, each of which has the same configuration as the semiconductor package shown in FIG. 1, before the plurality of semiconductor packages are separated from each other.
Figure 3:
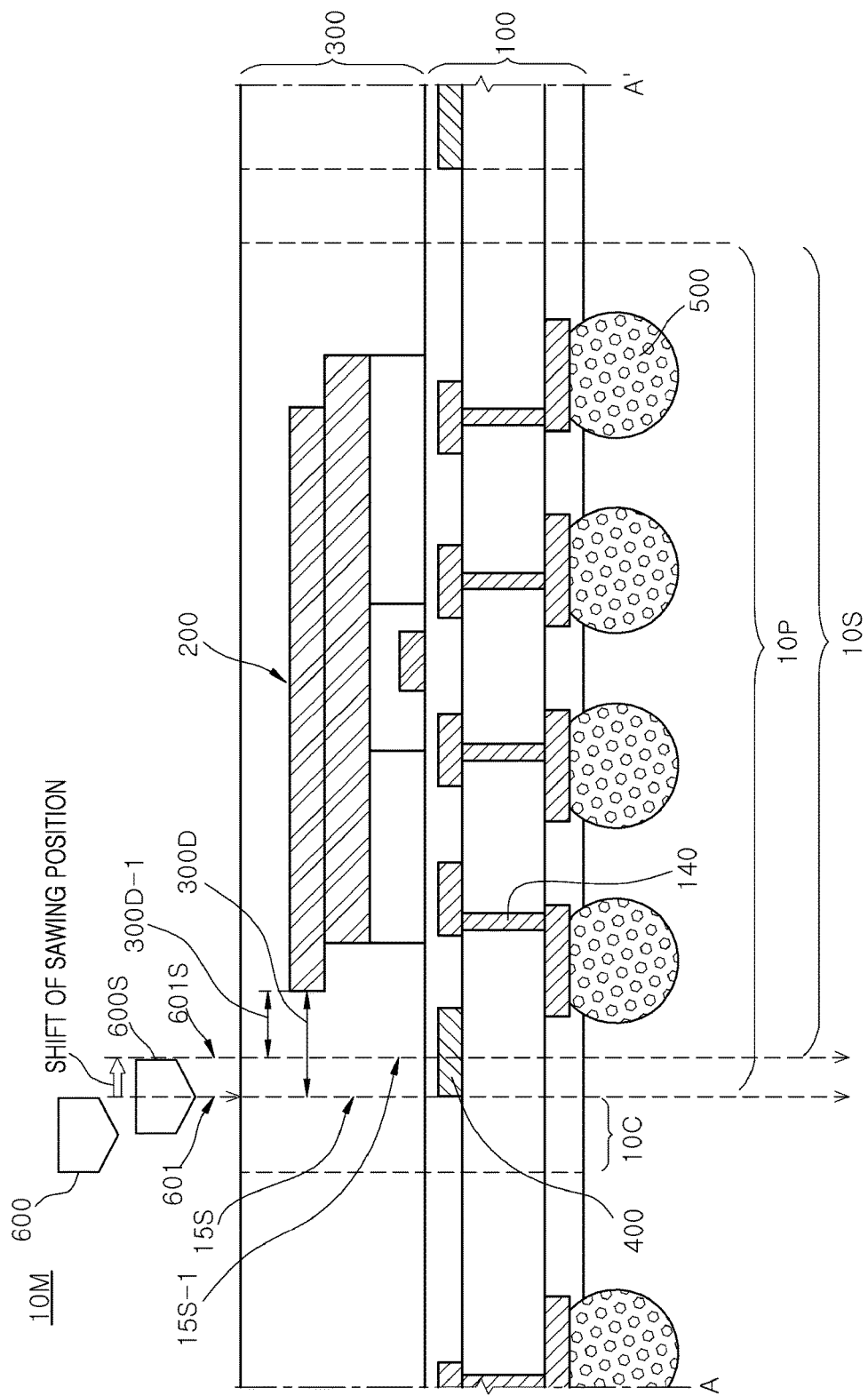
FIG. 3 is a cross-sectional view taken along a line A-A' of FIG. 2.

FIG. 1 is a cross-sectional view illustrating a semiconductor package 10S according to an embodiment. FIG. 2 is a plan view illustrating a semiconductor package array 10M including a plurality of semiconductor packages, each of which has the same configuration as the semiconductor package 10S shown in FIG. 1, before the plurality of semiconductor packages 10S are separated from each other. FIG. 3 is a cross-sectional view taken along a line A-A' of FIG. 2.

Referring to FIG. 1, the semiconductor package 10S may include a package substrate 100, a semiconductor chip 230 disposed on the package substrate 100, and an encapsulant 300 covering the semiconductor chip 230. Another semiconductor chip 210 may be additionally disposed on the package substrate 100. In such a case, the semiconductor chip 210 may correspond to a first semiconductor chip, and the semiconductor chip 230 may correspond to a second semiconductor chip. The first and second semiconductor chips 210 and 230 may constitute a semiconductor chip stack 200. The plurality of semiconductor packages 10S of the semiconductor package array 10M shown in FIG. 2 may be separated from each other. That is, a singulation process may be applied to the semiconductor package array 10M shown in FIG. 2 to obtain the separate semiconductor package 10S shown in FIG. 1.

The semiconductor package array 10M shown in FIGS. 2 and 3 may be comprised of the plurality of semiconductor packages 10S which are connected to each other by a cutting region 10C. For the purpose of ease and convenience in explanation, the encapsulant 300 is omitted in FIG. 2. Package regions 10P defined and surrounded by the cutting region 10C may be separated from each other to provide the plurality of semiconductor packages 10S. The cutting region 10C may correspond to a scribe lane region or a sawing region. The cutting region 10C may have a grid shape or a lattice shape to define the package regions 10P corresponding to lattice windows. Since the plurality of semiconductor packages 10S are separated from each other by sawing the cutting region 10C, the cutting region 10C may be removed during a sawing process or a singulation process for separating the plurality of semiconductor packages 10S. The sawing process may be performed using a cutting means such as a sawing blade (600 of FIG. 3).

Referring to FIG. 3, a cutting means, for example, the sawing blade 600 may not be accurately aligned with a normal sawing position 601 in the cutting region 10C during the sawing process due to a process allowable tolerance of a sawing machine including the sawing blade 600. In such a case, a portion of each of the package regions 10P may be undesirably removed while the sawing process is performed. That is, a shifted sawing blade 600S may be aligned with a shifted sawing position 601S located in the package region 10P because of the process tolerance of the sawing machine. As a result, a portion of each package region 10P may be undesirably removed while the sawing process is performed.

If the sawing blade 600 is accurately aligned with the cutting region 10C, the semiconductor package 10S after the sawing process may have a side surface 15S which is taken along the normal sawing position 601. However, if an actual sawing position moves from the normal sawing position 601 to the shifted sawing position 601S, the semiconductor package 10S after the sawing process may have a side surface 15S-1 which is taken along the shifted sawing position 601S that is moved from the normal sawing position 601 toward the semiconductor chip stack 200. In such a case, since the side surface 15S-1 is located in the inside of the semiconductor package 10S, a distance 300D-1 between the side surface 15S-1 and the semiconductor chip stack 200 may become less than a distance 300D between the side surface 15S and the semiconductor chip stack 200.

As described above, if the actual sawing position moves toward the semiconductor chip stack 200 such that a portion of the package region 10P is removed, the distance 300D-1 between the side surface 15S-1 and the semiconductor chip stack 200 may be less than a designed value. That is, a package side margin related to the distance 300D-1 between the side surface 15S-1 and the semiconductor chip stack 200 of the semiconductor package 10S may be reduced. In such a case, a width of a sidewall portion of the encapsulant 300 may be reduced such that the semiconductor chip stack 200 is not sufficiently protected by the encapsulant 300. If the package side margin of the semiconductor package 10S is reduced, moisture may easily infiltrate into the semiconductor package 10S through an interface between the encapsulant 300 and the package substrate 100 to degrade the reliability of the semiconductor package 10S or to cause malfunction of the semiconductor chips 210 and 230. In addition, if the moisture infiltrates into the semiconductor package 10S, the first semiconductor chip 210 may be lifted or delaminated from the package substrate 100. Moreover, if the moisture infiltrates into the semiconductor package 10S, an adhesive strength between encapsulant 300 and the package substrate 100 may be reduced to cause a delamination phenomenon of the encapsulant 300.

It may be necessary to evaluate a margin of the distance 300D-1 between the side surface 15S-1 and the semiconductor chip stack 200 of the semiconductor package 10S in order to sort good packages from failed packages and in order to realign the sawing blade 600. However, it may be difficult to observe the semiconductor chip stack 200 embedded in the semiconductor package 10S and to measure or evaluate a package side margin of the semiconductor package 10S after the semiconductor package 10S is fabricated. This is because the encapsulant 300 covering the semiconductor chip stack 200 is formed of an opaque material and the package substrate 100 supporting the semiconductor chip stack 200 is also formed of an opaque dielectric material.

Referring to FIG. 1, the distance 300D-1 between the side surface 15S-1 of the semiconductor package 10S and a side surface 205 of the semiconductor chip stack 200 is exaggerated for clarity of illustration. If a width 200W of the semiconductor chip stack 200 to a width 10W of the semiconductor package 10S ratio increases, an allowable range of the distance 300D-1 between the side surface 15S-1 of the semiconductor package 10S and a side surface 205 of the semiconductor chip stack 200 may be reduced because the width 10W of the semiconductor package 10S may be fixed. As illustrated in FIG. 3, if the sawing process is performed along the shifted sawing position 601S, the distance 300D-1 may be reduced to past the allowable range of the distance 300D. That is, a width of a sidewall of the encapsulant 300 may be significantly reduced to cause a smaller package side margin of the semiconductor package. Also, it may be difficult to evaluate the package side margin of the semiconductor package 10S.

Referring again to FIG. 1, the semiconductor package 10S may further include an indicator 400. The indicator 400 may be designed such that the distance 300D-1 between the side surface 15S-1 of the semiconductor package 10S and a side surface 205 of the semiconductor chip stack 200 can be measured or evaluated after the sawing process is performed. The indicator 400 may be disposed in or on the package substrate 100 and may be cut during the sawing process. Thus, a side surface 405R of the indicator 400 may be exposed at the side surface 15S-1 of the semiconductor package 10S after the sawing process is performed. Accordingly, it may be possible to observe the side surface 405R of the indicator 400 after the sawing process is performed. In an embodiment, for example, an indicator 400 may be a three-dimensional shape. In an embodiment, for example, an indicator 400 may be a polyhedron. In an embodiment, for example, an indicator 400 may be a three-dimensional shape including curves.

The indicator 400 may be designed such that the distance 300D-1 between the side surface 15S-1 of the semiconductor package 10S and a side surface 205 of the semiconductor chip stack 200 can be extracted from a shape and/or a width of the exposed side surface 405R of the indicator 400. That is, it may be possible to confirm the package side margin of the semiconductor package 10S with a shape and/or a width of the exposed side surface 405R of the indicator 400. A method of confirming or evaluating the package side margin of the semiconductor package 10S with a shape and/or a width of the exposed side surface 405R of the indicator 400 will be described below.

Although FIG. 1 illustrates an example in which the semiconductor chip stack 200 is disposed on the package substrate 100, at least one of the semiconductor chips constituting the semiconductor chip stack 200 may be embedded in the package substrate 100 according to the embodiments. The semiconductor chip stack 200 may be provided such that the first and second semiconductor chips 210 and 230 may be stacked to be offset. For example, the second semiconductor chip 230 may be stacked on the first semiconductor chip 210 to expose an edge portion 210E of the first semiconductor chip 210. In some embodiments, the second semiconductor chip 230 may be vertically stacked on the first semiconductor chip 210 without providing an offset structure.

A third semiconductor chip 250 may be additionally disposed under the first semiconductor chip 210. The first and second semiconductor chips 210 and 230 may have the same function, and the third semiconductor chip 250 may have a different function from the first and second semiconductor chips 210 and 230. For example, if the first and second semiconductor chips 210 and 230 are NAND-type flash memory chips, the third semiconductor chip 250 may be a controller chip that controls operations of the first and second semiconductor chips 210 and 230.

A supporting part 251 may be included in the semiconductor package 10S to provide a space in which the third semiconductor chip 250 is disposed. The supporting part 251 may be disposed between the first semiconductor chip 210 and the package substrate 100 to support the first semiconductor chip 210. The supporting part 251 may have a cavity in a central portion thereof, and the third semiconductor chip 250 may be disposed in the cavity of the supporting part 251. The supporting part 251 may be provided to support edge portions of the first semiconductor chip 210. The supporting part 251 may be an adhesive layer.

The package substrate 100 may include an interconnection structure for electrically connecting the semiconductor chip stack 200 to an external device. The interconnection structure may include conductive interconnection patterns 140. The conductive interconnection patterns 140 may include first interconnection patterns 142 disposed on a surface of a body layer 110 of the package substrate 100. A first dielectric layer 120 may be disposed on a surface of the body layer 110 to cover the first interconnection patterns 142. A top surface of the first dielectric layer 120 may correspond to a first surface 101 of the package substrate 100. The conductive interconnection patterns 140 may further include second interconnection patterns 144 disposed on a surface of the body layer 110 opposite to the first interconnection patterns 142. A second dielectric layer 130 may be disposed on a surface of the body layer 110 to cover the second interconnection patterns 144. A bottom surface of the second dielectric layer 130 may correspond to a second surface 103 of the package substrate 100. While the indicator 400 illustrated in FIG. 1 is located at the same level as the first interconnection patterns 142 disposed between the body layer 110 and the first dielectric layer 120 of the package substrate 100, in an embodiment, for example, the indicator 400 may be located at the same level as the second interconnection patterns 144. In an embodiment, for example, the indicator 400 may be located at the same level as the internal interconnection patterns 143. In an embodiment, for example, the indicator 400 may be located at the same level or levels as all or less than all of the interconnection patterns of the interconnection structure 140. In an embodiment, for example, the indicator 400 may be located at the same level as the interconnection structure 140.

Internal interconnection patterns 143 may be disposed to penetrate the body layer 110 and to electrically connect the first interconnection patterns 142 to the second interconnection patterns 144. The internal interconnection patterns 143 may include conductive vias that substantially penetrate the body layer 110. The second dielectric layer 130 may be provided to expose the second interconnection patterns 144. Outer connectors 500 such as solder balls may be attached to the second interconnection patterns 144 exposed by the second dielectric layer 130. Each of the first and second dielectric layers 120 and 130 may include a dielectric material, for example, a solder resist material.

Figure 4:
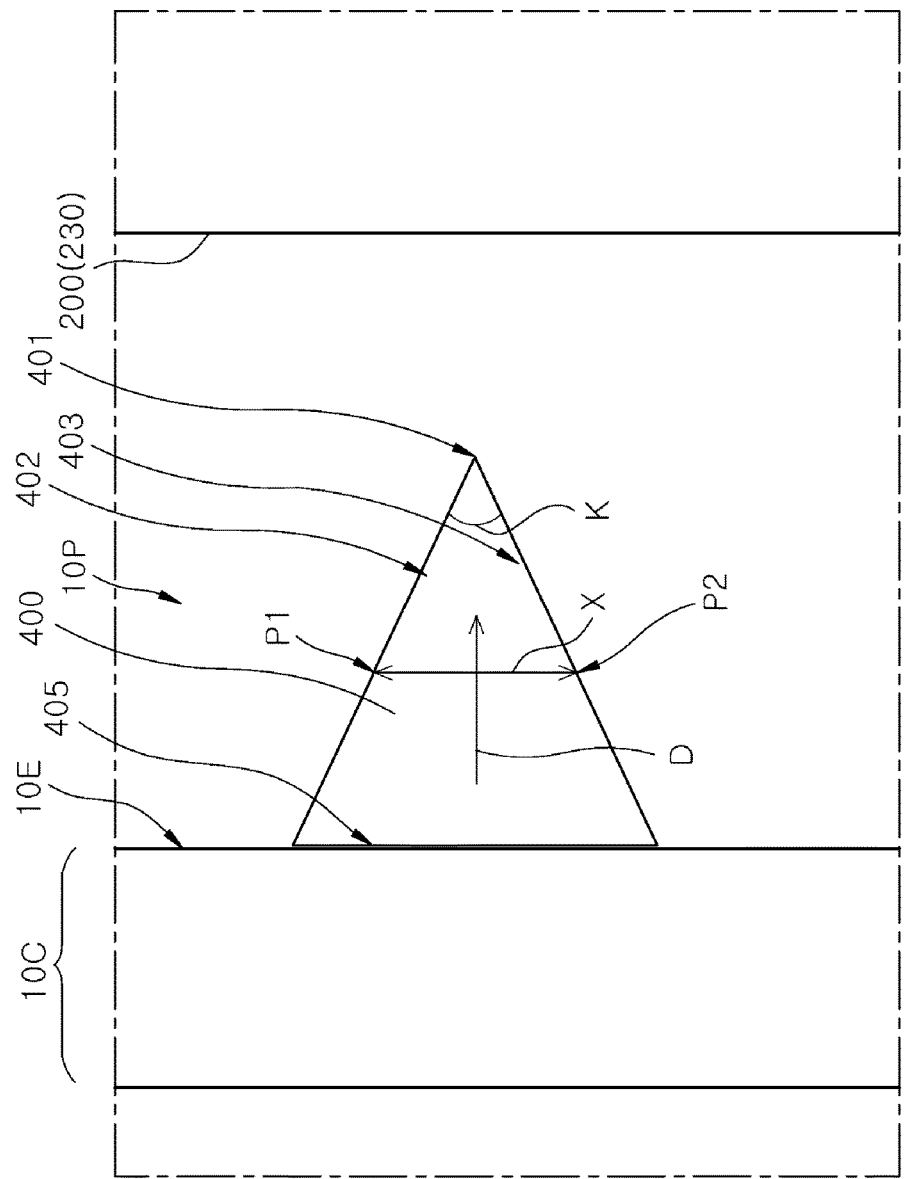
FIGS. 4 and 5 are plan views illustrating two different indicators employed in semiconductor packages according to some embodiments.
Figure 5:
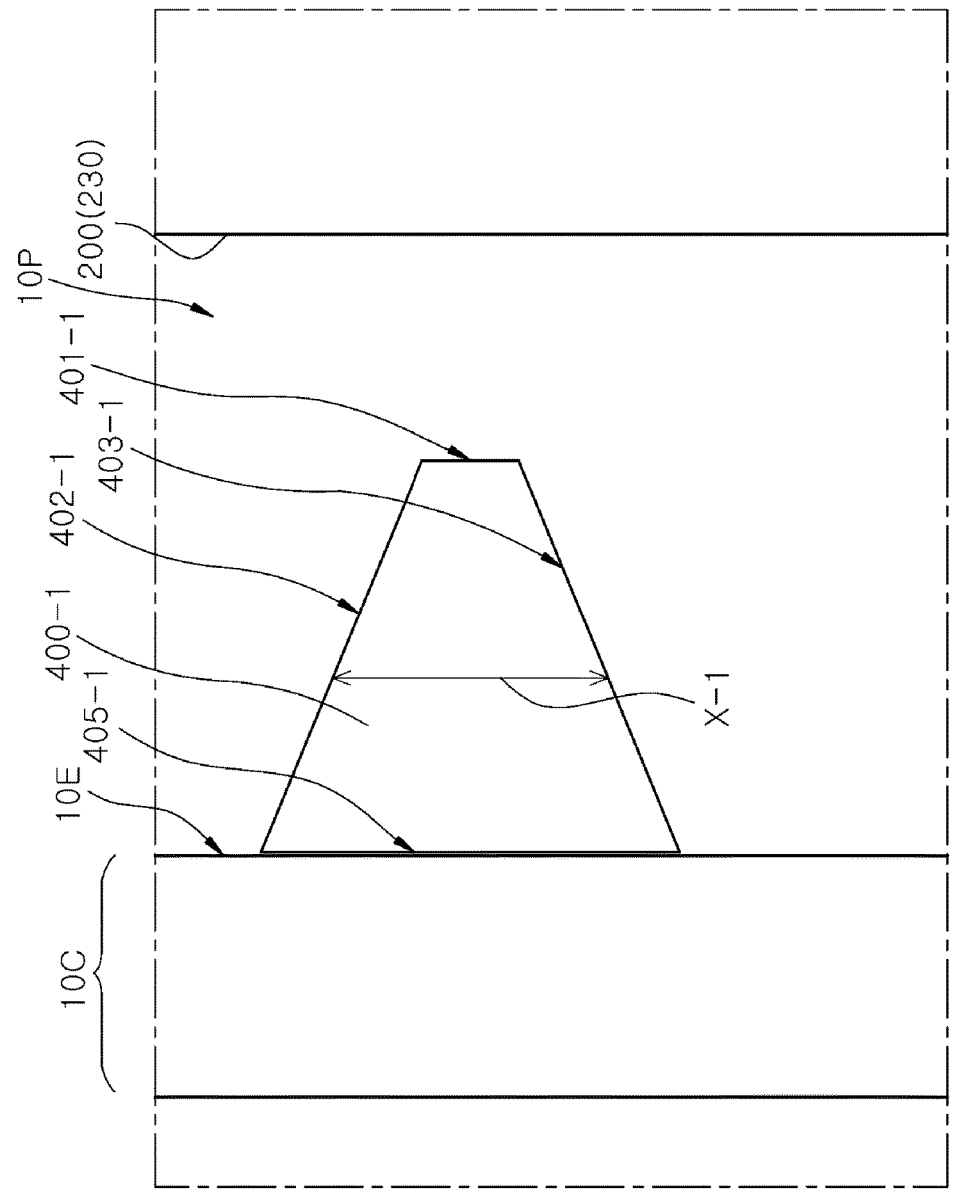

FIG. 4 is a plan view illustrating the indicator 400 employed in the semiconductor package 10S. FIG. 5 is a plan view illustrating another indicator 400-1 employed in the semiconductor package 10S. FIG. 4 is an enlarged view of a portion "B" in FIG. 2, and FIG. 5 is an enlarged view of the indicator 400-1 corresponding to the indicator 400 of FIG. 4.

Referring to FIG. 4, the indicator 400 may have a polygonal shape, for example, a triangular shape in a plan view. The indicator 400 having a shape of a triangular pattern may be disposed such that one 401 of three vertices of the indicator 400 faces one of side surfaces (i.e., 205) of the second semiconductor chip 230 or the semiconductor chip stack 200. A first side surface 405 of the indicator 400 opposite to the vertex 401 may face the cutting region 10C. Extension lines of a second side surface 402 and a third side surface 403 of the indicator 400 may intersect an edge line 10E of the cutting region 10C at a non-right angle. In an embodiment, for example, a second side surface 402 and a third side surface 403 of the indicator 400 may intersect an edge line 10E of the cutting region 10C at angles that are not at 90 degrees. The first side surface 405 of the indicator 400 may be parallel or substantially parallel with the edge line 10E of the cutting region 10C in a plan view. The first side surface 405 of the indicator 400 may overlap with the edge line 10E of the cutting region 10C or may be adjacent to the edge line 10E of the cutting region 10C, in a plan view. That is, the indicator 400 may be a triangular pattern which is designed to face the semiconductor chip stack 200 by having a vertex (i.e., 401) point at or face the semiconductor chip stack 200 while having a side surface (i.e., 405) face the edge line 10E of the cutting region 10C.

As illustrated in a plan view of FIG. 4, a width X of the indicator 400 in a direction substantially parallel with the edge line 10E may vary from the cutting region 10C toward the semiconductor chip stack 200. Extension lines of the second side surface 402 and the third side surface 403 of the indicator 400 may intersect the edge line 10E of the cutting region 10C at a non-right angle, and the second and third side surfaces 402 and 403 of the indicator 400 may meet each other at the first vertex 401. Thus, the width X of the indicator 400 in a direction of the edge line 10E may be gradually reduced along a direction "D" from the cutting region 10C toward the semiconductor chip stack 200. The width X of the indicator 400 may correspond to a distance between a first point P1 on the second side surface 402 and a second point P2 on the third side surface 403, when viewed from a plan view. That is, the width X of the indicator 400 may be gradually reduced as a position indicating the width X becomes closer to the first vertex 401 of the indicator 400. A straight line extending from the first point P1 toward the second point P2 may be substantially parallel with the edge line 10E of the cutting region 10C. In an embodiment, for example, this straight line extending from the first point P1 toward the second point P2 may be a vertical section having a width X of the indicator and this vertical section may be parallel with or substantially parallel with the first side surface 405 of the indicator 400 adjacent to or in contact with the cutting region 10C. The width X of this vertical section may vary as the vertical section of the indicator 400 becomes father from the side surface 15S-1 of the semiconductor package 10S.

As illustrated in FIG. 4, the indicator 400 having a triangular shape may be disposed such that the first side surface 405 of the indicator 400 is adjacent to or in contact with the cutting region 10C. However, in some other embodiments, the indicator 400 having a triangular shape may be disposed such that the first side surface 405 of the indicator 400 faces the semiconductor chip stack 200 and the first vertex 401 of the indicator 400 is adjacent to or in contact with the cutting region 10C. For example, in an embodiment, the first side surface 405 of the indicator 400 may be located closer to the semiconductor chip stack 200 than the first vertex 401 and, thus, the first vertex 401 may be located closer to the cutting region 10C than the side surface 405. The second side surface 402 and the third side surface 403 of the indicator 400 may have the same length in a plan view. Accordingly, the indicator 400 may have a shape of an isosceles triangle in a plan view. However, the present disclosure is not limited to an example in which a planar shape of the indicator 400 is an isosceles triangle. That is, a plan view of the indicator 400 may have any one of various triangular shapes according to the embodiments. In any event, the indicator 400 may be designed such that the width X of the indicator 400 in a direction of the edge line 10E gradually decreases or increases from the cutting region 10C toward the semiconductor chip stack 200.

Referring to FIG. 5, the indicator 400-1 corresponding to another example of the indicator 400 may have a polygonal shape with at least four sides, for example, a trapezoid shape in a plan view. In such a case, a width X-1 of the indicator 400-1 in a direction substantially parallel with the edge line 10E of the cutting region 10C may gradually decrease or increase from the cutting region 10C toward the semiconductor chip stack 200.

A first side surface 405-1 of the indicator 400-1 having a trapezoid shape may face the cutting region 10C. A second side surface 401-1 of the indicator 400-1 opposite to the cutting region 10C and parallel or substantially parallel with the first side surface 405-1 may face the semiconductor chip stack 200. For example, in an embodiment, the first side surface 405-1 may be located closer to the cutting region 10C than the second side surface 401-1 and the second side surface 401-1 may be located closer to the semiconductor chip stack 200 than the first side surface 405-1 of the indicator 400-1. Extension lines of a third side surface 402-1 and a fourth side surface 403-1 of the indicator 400 may intersect the edge line 10E of the cutting region 10C at a non-right angle. In an embodiment, for example, a third side surface 402-1 and a fourth side surface 403-1 of the indicator 400-1 may intersect an edge line 10E of the cutting region 10C at angles that are not at 90 degrees. The first side surface 405-1 of the indicator 400-1 having a trapezoid shape may be parallel or substantially parallel with the edge line 10E of the cutting region 10C in a plan view. The first side surface 405-1 of the indicator 400-1 having a trapezoid shape may overlap with the edge line 10E of the cutting region 10C or may be adjacent to the edge line 10E of the cutting region 10C, in a plan view. That is, the indicator 400-1 may be a trapezoid pattern which is designed to face the semiconductor chip stack 200 by having a second side surface 401-1 face the semiconductor chip stack 200 and a first side surface 405-1 face the edge line 10E of the cutting region 10C.

As illustrated in FIG. 5, the indicator 400-1 having a trapezoid shape may be designed such that a length of the second side surface 401-1 adjacent to the semiconductor chip stack 200 is less than a length of the first side surface 405-1 adjacent to the cutting region 10C, in a plan view. However, in some other embodiments, the indicator 400-1 having a trapezoid shape may be disposed such that the second side surface 401-1 (having a length less than a length of the first side surface 405-1) of the indicator 400-1 is adjacent to or is in contact with the cutting region 10C and the first side surface 405-1 (having a length greater than a length of the second side surface 401-1) of the indicator 400-1 is adjacent to the semiconductor chip stack 200, in a plan view.

If the semiconductor package 10S illustrated in FIG. 1 is provided after the sawing process, the side surface 405R of the indicator 400 may be exposed at the side surface 15S-1 of the semiconductor package 10S. In such a case, a width of the side surface 405R of the indicator 400 in a direction parallel with the edge line (10E of FIG. 5) may vary according to the sawing position determined by an alignment accuracy between the cutting region (10C of FIG. 3) and the sawing blade (600 of FIG. 3). The distance 300D-1 between the semiconductor chip stack 200 and the side surface 15S-1 of the semiconductor package 10S may be evaluated using a value of the width of the side surface 405R. That is, the distance 300D-1 between the semiconductor chip stack 200 and the side surface 15S-1 of the semiconductor package 10S may be calculated using a value of the width of the side surface 405R. Thus, the distance 300D-1 between the semiconductor chip stack 200 and the side surface 15S-1 of the semiconductor package 10S may be extracted without even using a decap process for removing the encapsulant 300 or a non-destructive analysis technique with an X-ray.

According to an above embodiment, a margin of the distance 300D-1 between the semiconductor chip stack 200 and the side surface 15S-1 of the semiconductor package 10S may be evaluated using a value of the width of the side surface 405R. Thus, it may be possible to sort good packages from failed packages after the sawing process. A method of evaluating the distance 300D-1 between the semiconductor chip stack 200 and the side surface 15S-1 of the semiconductor package 10S will be described in below hereinafter with reference to FIGS. 6 to 11.

FIGS. 6 to 11 illustrate a method of calculating or evaluating the distance 300D-1 between the semiconductor chip stack 200 and the side surface 15S-1 of the semiconductor package 10S using the indicator shown in FIGS. 2 and 4. FIGS. 6 to 11 are enlarged views of a portion "B" of FIG. 2.

Figure 6:
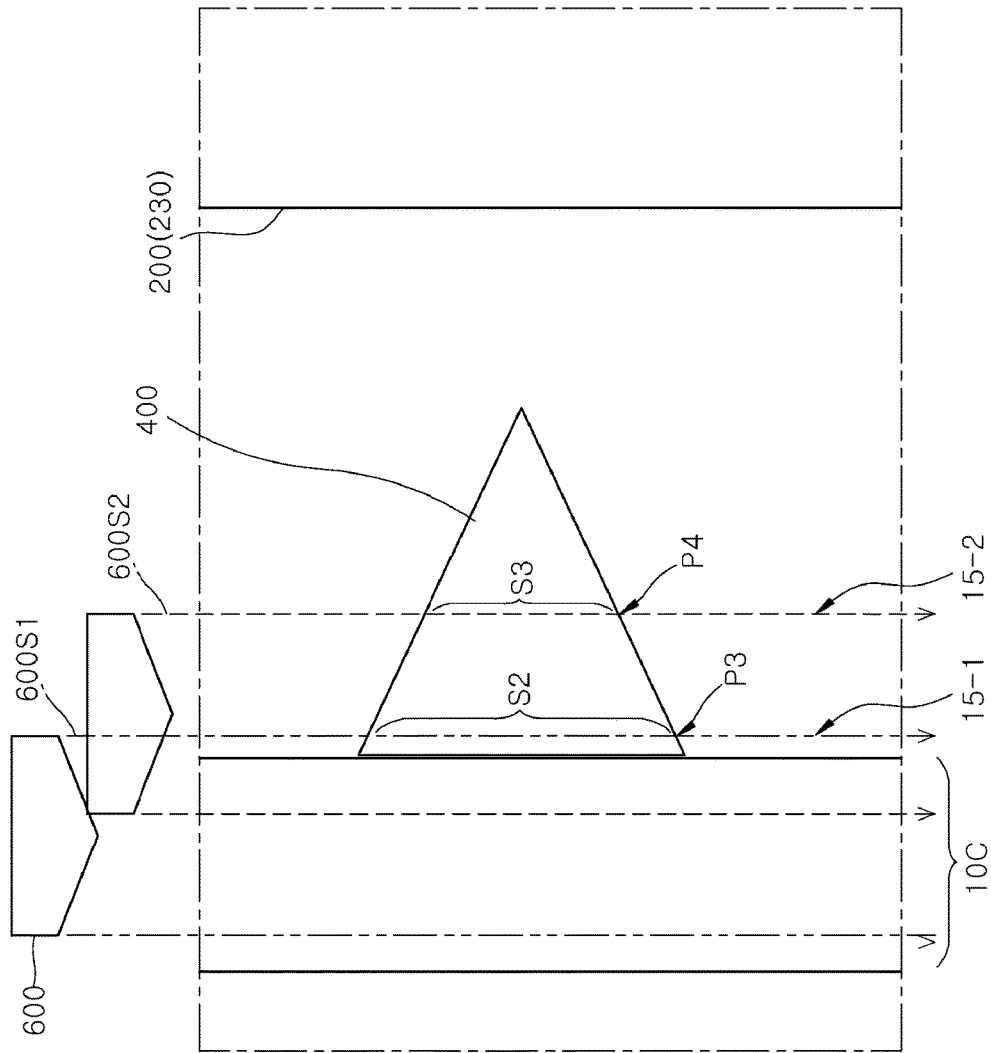
FIGS. 6 to 11 illustrate a method of utilizing the indicator shown in FIG. 4.

Referring to FIG. 6, if the sawing process is performed along the cutting region 10C using the sawing blade 600 aligned with a first sawing position 600S1, the indicator 400 and a molding layer may be cut to provide a first cut side surface 15-1 of the semiconductor package 10S. Alternatively, if the sawing process is performed along the cutting region 10C using the sawing blade 600 aligned with a second sawing position 600S2, the indicator 400 and a molding layer may be cut to provide a second cut side surface 15-1 of the semiconductor package 10S. The first cut side surface 15-1 may be located at a position which is different from a position of the second cut side surface 15-2. The first cut side surface 15-1 may be spaced apart from the second cut side surface 15-2 by a distance between the first and second sawing positions 600S1 and 600S2. Thus, a first position P3 of the first cut side surface 15-1 exposed by the sawing process performed along the first sawing position 600S1 may be spaced apart from a second position P4 of the second cut side surface 15-2 exposed by the sawing process performed along the second sawing position 600S2. In addition, a first length S2 of a first cut side surface (405R-1 of FIG. 7) of the indicator 400 in a direction of the cutting region 10C may be greater than a second length S3 of a second cut side surface (405R-2 of FIG. 9) of the indicator 400 in a direction of the cutting region 10C.

Figure 7:
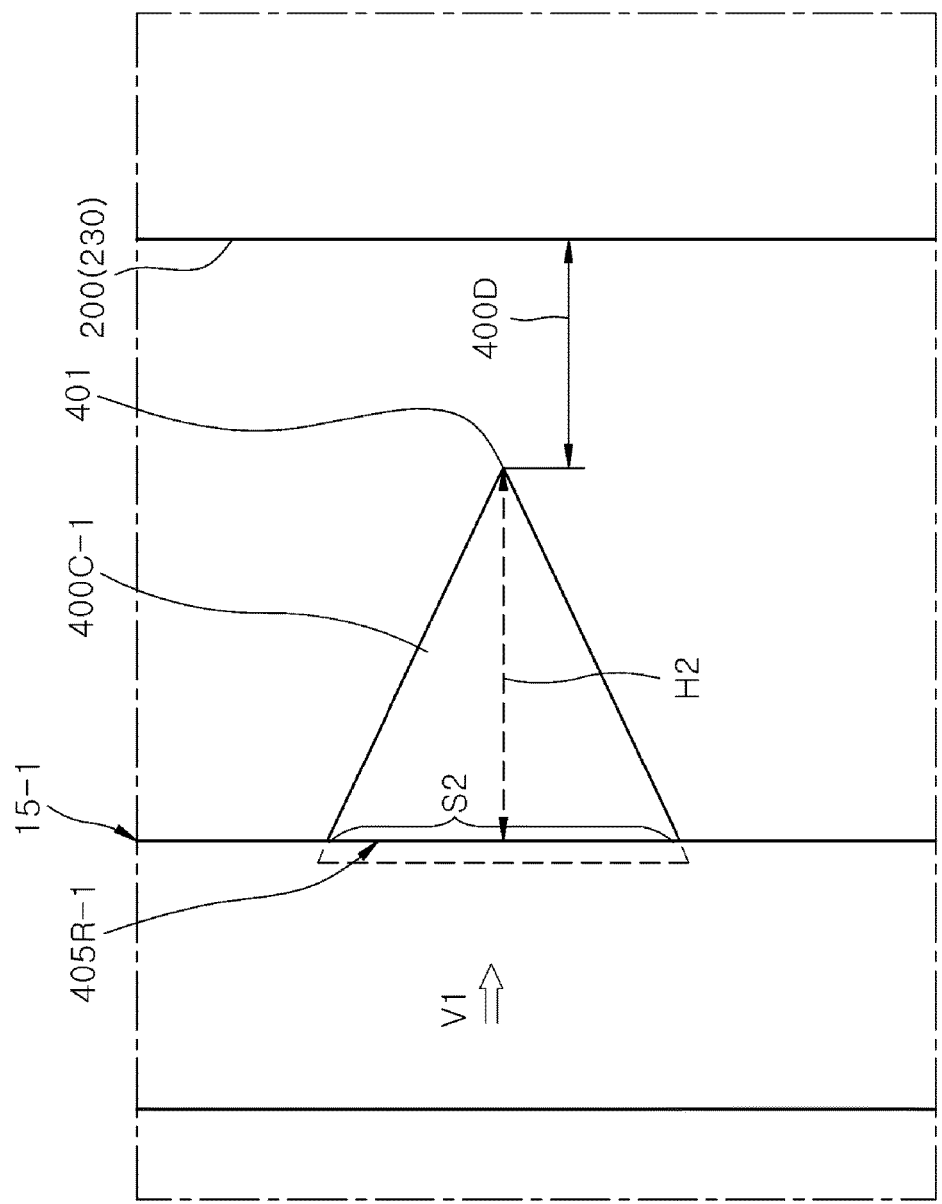
Figure 8:
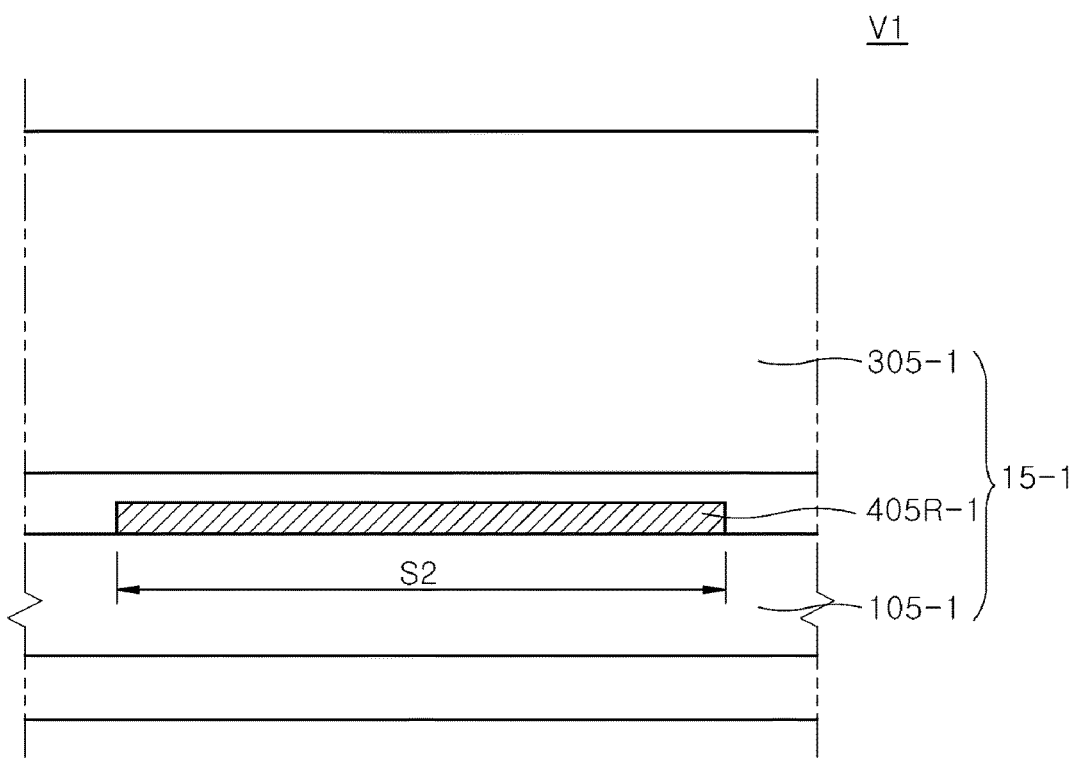

FIG. 7 is a plan view illustrating a first indicator 400C-1 that remains to have the first cut side surface 405R-1 after the sawing process performed along the first sawing position 600S1. The first cut side surface 405R-1 of the first indicator 400C-1 may be exposed at the first cut side surface 15-1 of the semiconductor package 10S. A sectional view V1 corresponding to the first cut side surface 405R-1 of the first indicator 400C-1 is illustrated in a side cross-sectional view of FIG. 8. The first cut side surface 405R-1 of the first indicator 400C-1 may be a portion of a first cut side surface 105-1 of the package substrate 100, and the first cut side surface 15-1 of the semiconductor package 10S may include a first cut side surface 305-1 of the encapsulant 300.

Since the first cut side surface 405R-1 of the first indicator 400C-1 is exposed at the first cut side surface 15-1 of the semiconductor package 10S, it may be possible to observe the first cut side surface 405R-1 of the first indicator 400C-1 after the sawing process. That is, it may be possible to measure the first length S2 corresponding a width of the first cut side surface 405R-1 of the first indicator 400C-1 even without using an X-ray analysis technique or the like after the sawing process. A distance H2 between the first cut side surface 405R-1 of the first indicator 400C-1 and the first vertex 401 of the first indicator 400C-1 may be expressed by a mathematical equation employing the first length S2 of the first cut side surface 405R-1 as a variable parameter. Thus, the distance H2 may be calculated and extracted using the first length S2 of the first cut side surface 405R-1.

A position of the indicator 400 providing the first indicator 400C-1 may be determined at a design step of the semiconductor package 10S. That is, a distance 400D between the first vertex 401 of the first indicator 400C-1 and the semiconductor chip stack 200 may be determined at a design step of the semiconductor package 10S regardless of the sawing process. A sum of the distance 400D and the distance H2 may correspond to the distance (300D-1 of FIG. 1) between the first cut side surface 405R-1 (or the first cut side surface 15-1) and the semiconductor chip stack 200.

If the distance H2 is calculated using the first length S2 of the first cut side surface 405R-1, the distance (300D-1 of FIG. 1) between the first cut side surface 405R-1 (or the first cut side surface 15-1) and the semiconductor chip stack 200 may be simply obtained by adding the distance H2 to the distance 400D. As a result, it may be possible to correctly find out a position of the semiconductor chip stack 200 disposed in the semiconductor package 10S even without using a destructive analysis technique or an X-ray analysis technique after the sawing process. Thus, it may be possible to discriminate whether the distance (300D-1 of FIG. 1) between the first cut side surface 405R-1 (or the first cut side surface 15-1) and the semiconductor chip stack 200 is out of specification or in an allowable range. That is, it may be possible to confirm or evaluate the package side margin of the semiconductor package 10S.

Figure 9:
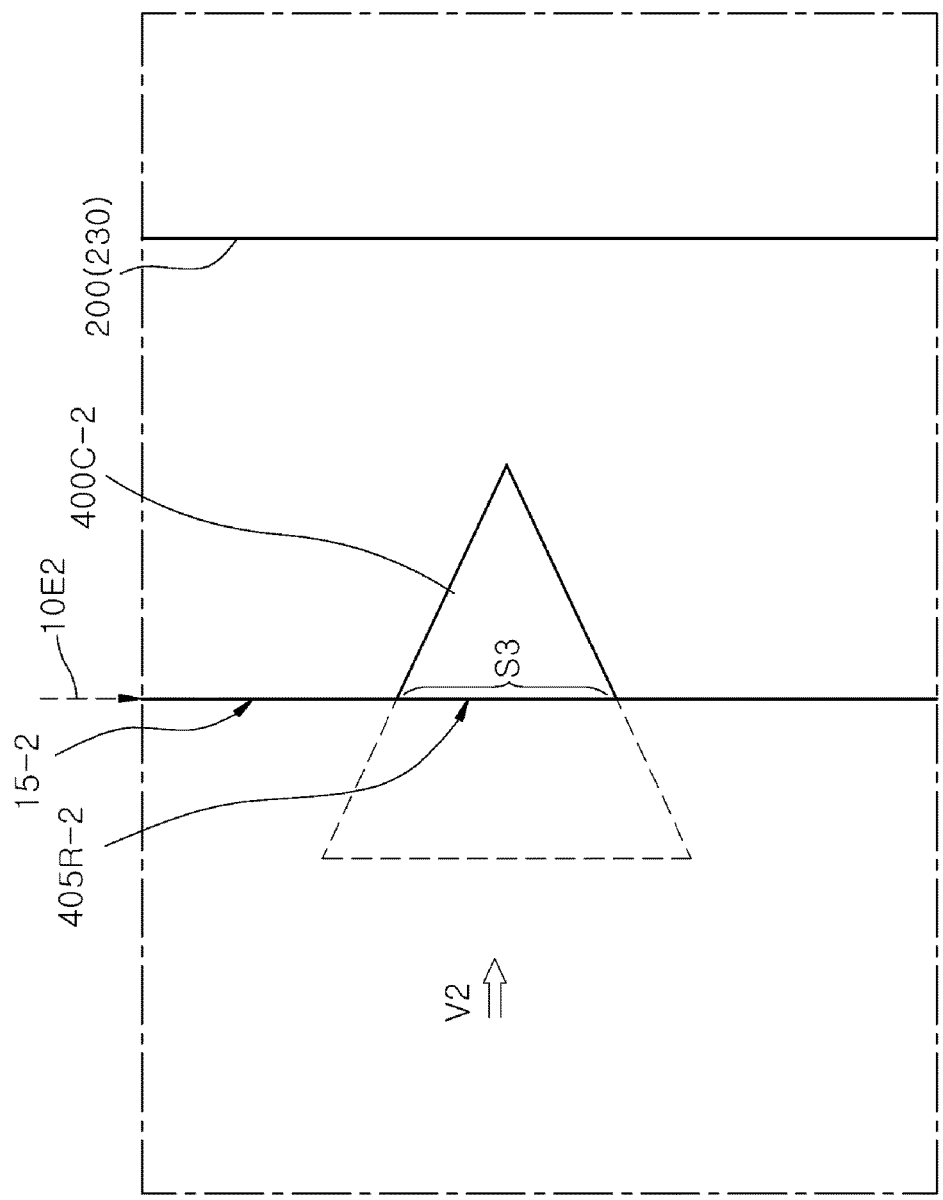
Figure 10:
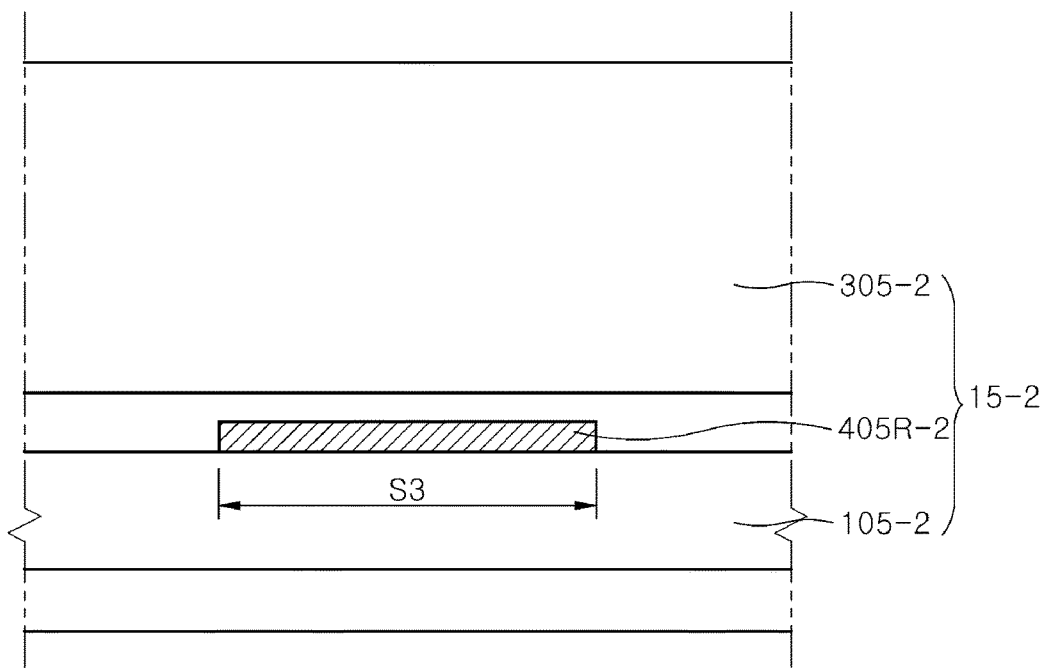

FIG. 9 is a plan view illustrating a second indicator 400C-2 that remains to have the second cut side surface 405R-2 after the sawing process is performed along the second sawing position 600S2. The second cut side surface 405R-2 of the second indicator 400C-2 may be exposed at the second cut side surface 15-2 of the semiconductor package 10S. A sectional view V2 corresponding to the second cut side surface 405R-2 of the second indicator 400C-2 is illustrated in a side cross-section view of FIG. 10. The second cut side surface 405R-2 of the second indicator 400C-2 may be a portion of a second cut side surface 105-2 of the package substrate 100, and the second cut side surface 15-2 of the semiconductor package 10S may include a second cut side surface 305-2 of the encapsulant 300. Since the second cut side surface 405R-2 of the second indicator 400C-2 is exposed at the second cut side surface 15-2 of the semiconductor package 10S, it may be possible to observe the second cut side surface 405R-2 of the second indicator 400C-2 after the sawing process. Thus, it may be possible to measure the second length S3 corresponding to a width of the second cut side surface 405R-2 of the second indicator 400C-2 even without using an X-ray analysis technique or the like after the sawing process.

Figure 11:
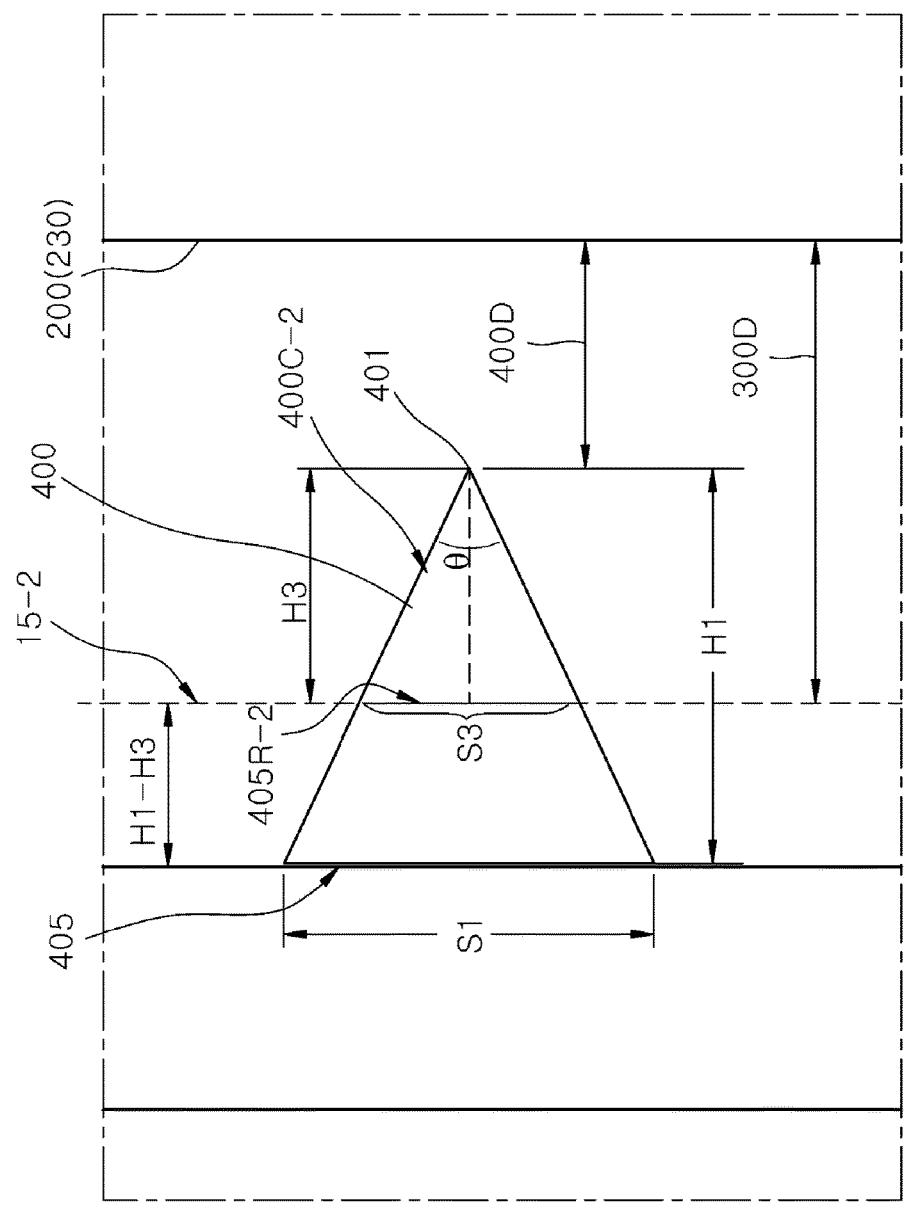

Referring to FIG. 11, if the second length S3 corresponding to a width of the second cut side surface 405R-2 is measured, the distance 300D between the second cut side surface 405R-2 and the semiconductor chip stack 200 may be calculated using the second length S3. That is, a distance H3 between the second cut side surface 405R-2 and the first vertex 401 may be calculated using an internal angle θ of the first vertex 401 and the second length S3 corresponding to a width of the second cut side surface 405R-2. The internal angle θ of the first vertex 401 may be determined at a layout step of the indicator 400, and the second length S3 may be obtained by measurement. In such a case, a relationship among the distance H3, the second length S3 and the internal angle θ may be expressed by the following equation 1.

$$\tan(\theta/2)=S3/(2\times H3)$$ (Equation 1)

Accordingly, if the second length S3 is obtained by measurement, the distance H3 may be calculated using the equation 1. As a result, the distance 300D between the second cut side surface 405R-2 and the semiconductor chip stack 200 may be obtained by adding the distance H3 to the distance 400D.

Alternatively, a length S1 corresponding to a width of the first side surface 405 of the indicator 400 may be determined at a layout step of the indicator 400, and a distance H1 between the first side surface 405 and the first vertex 401 may also be determined at a layout step of the indicator 400. Thus, a relationship among the distance H1, the distance H3, the length S1 and the length S3 may be expressed by the following equation 2.

$$S3/S1=H3/H1$$ (Equation 2)

Accordingly, if the second length S3 is obtained by measurement, the distance H3 may be calculated using the equation 2. As a result, the distance 300D between the second cut side surface 405R-2 and the semiconductor chip stack 200 may be obtained by adding the distance H3 to the distance 400D.

As described above, the distance H3 between the second cut side surface 405R-2 and the first vertex 401 may be calculated by the equation 1 or the equation 2 if the second length S3 corresponding to a width of the second cut side surface 405R-2 is measured. After the distance H3 is calculated, the distance 300D may be obtained by adding the distance H3 to the distance 400D. Even though the indicator 400 having a planar shape of an isosceles triangle is replaced with another indicator, for example, the trapezoid indicator 400-1 illustrated in FIG. 5, a distance between a side surface of the semiconductor package 10S and the semiconductor chip stack 200 may be obtained using a similar manner to the above description.

Figure 12:
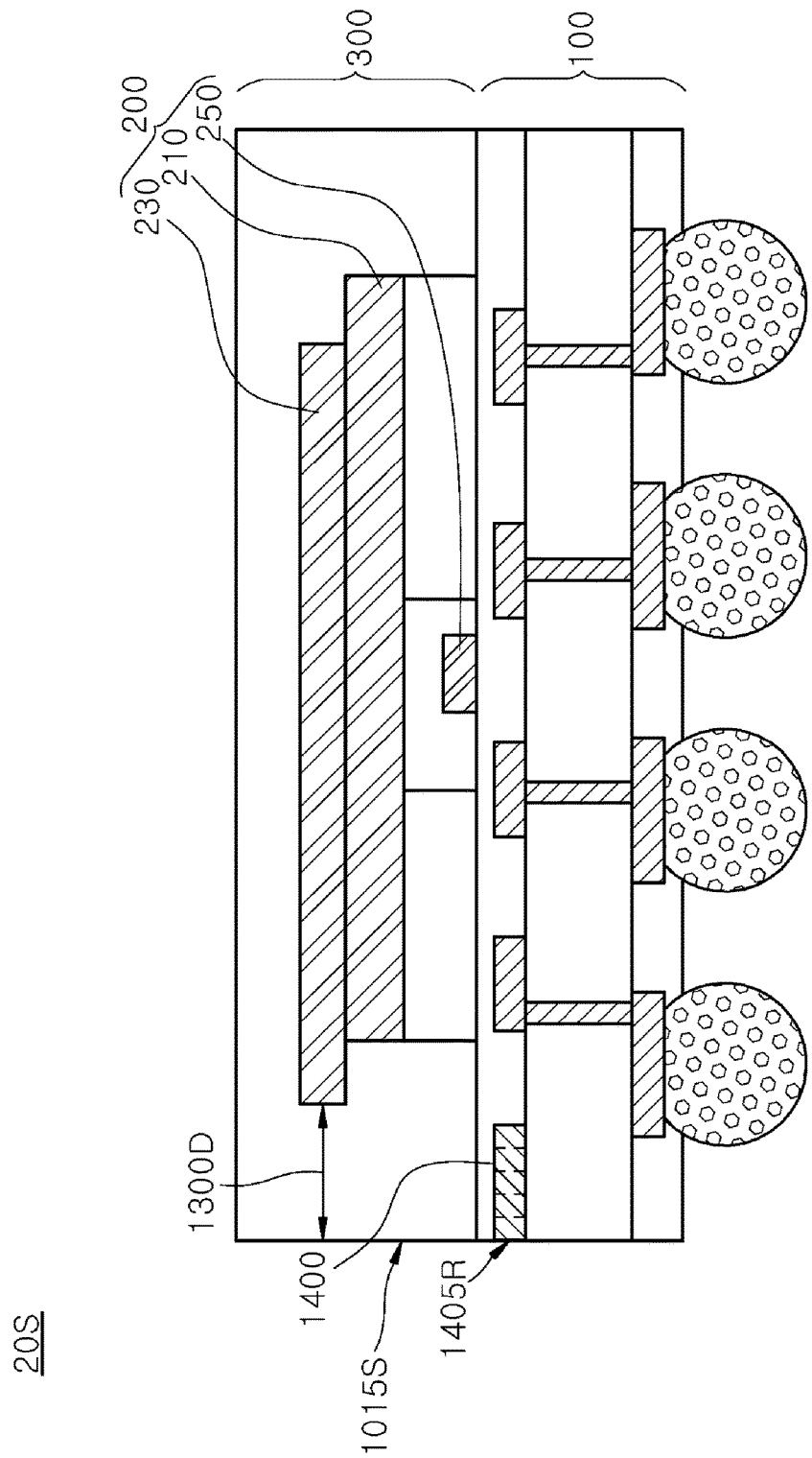
FIG. 12 is a cross-sectional view illustrating a semiconductor package according to another embodiment.
Figure 13:
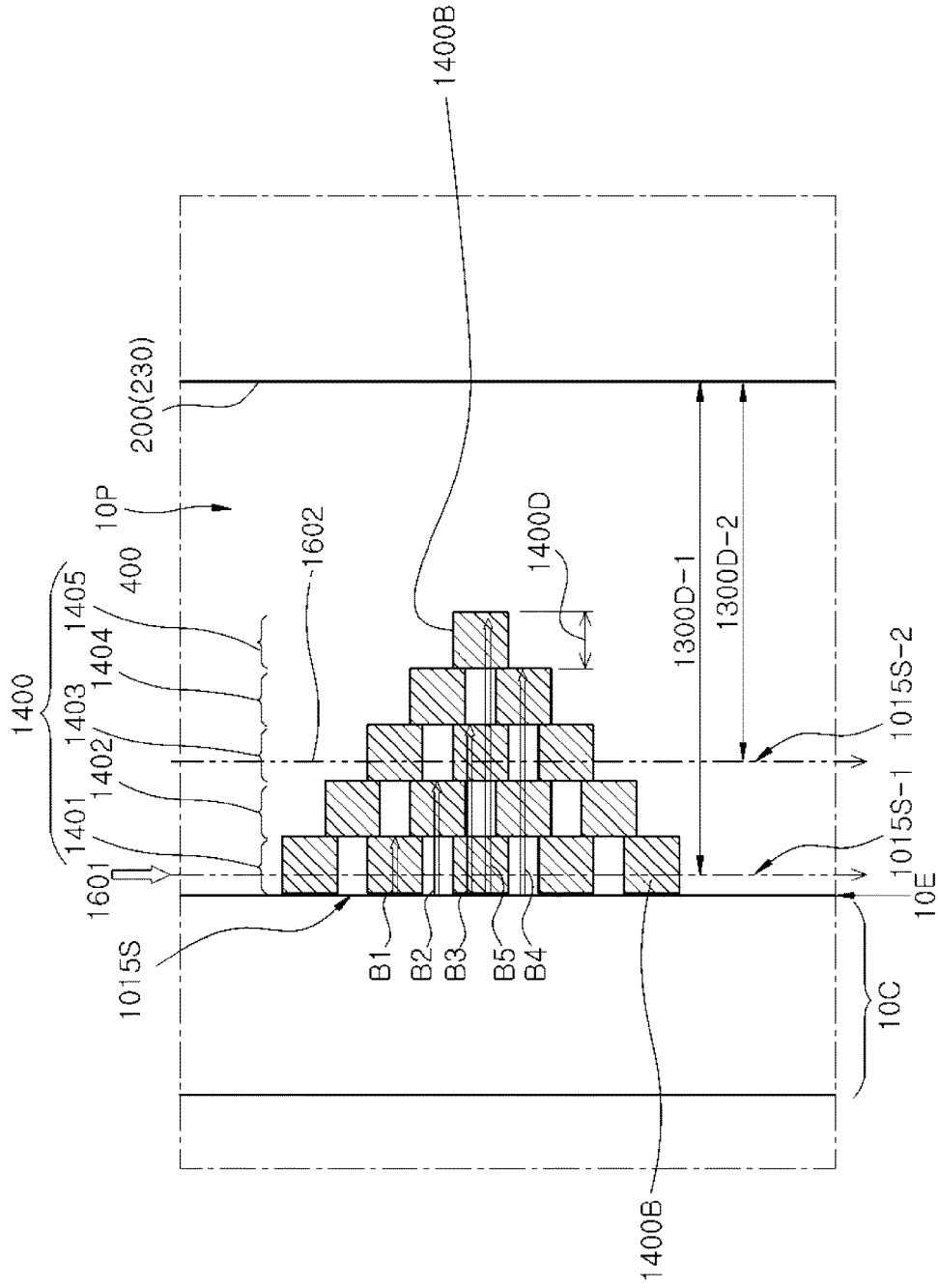
FIG. 13 is a plan view illustrating an indicator of the semiconductor package shown in FIG. 12.

FIG. 12 is a cross-sectional view illustrating a semiconductor package 20S according to another embodiment, and FIG. 13 is a plan view illustrating an indicator 1400 employed in the semiconductor package 20S illustrated in FIG. 12.

Referring to FIG. 12, the semiconductor package 20S may include the semiconductor chip stack 200 and the encapsulant 300 which are disposed on the package substrate 100. The semiconductor package 20S may be obtained by applying a sawing process to a semiconductor package array including a plurality of semiconductor packages. The semiconductor package 20S may include the indicator 1400, and the indicator 1400 may be cut during the sawing process. Thus, the indicator 1400 may have a cut side surface 1405R which is exposed after the sawing process. The semiconductor chip stack 200 may be provided to include the first to third semiconductor chips 210, 230 and 250, as illustrated in FIG. 1. In some embodiments, only the second semiconductor chip 230 among the first to third semiconductor chips 210, 230 and 250 may be disposed on the package substrate 100. The indicator 1400 indirectly indicating a distance 1300D between the semiconductor chip stack 200 and a cut side surface 1015S of the semiconductor package 20S may be disposed in or on the package substrate 100.

Referring to FIG. 13, the indicator 1400 of the semiconductor package 20S may include a plurality of indicating blocks 1400B which are arrayed in or on the package substrate 100. The indicating blocks 1400B may be disposed to be adjacent to the edge line 10E of the cutting region 10C defining the package region 10P. Some of the indicating blocks 1400B may be disposed to be in contact with the edge line 10E of the cutting region 10C defining the package region 10P. In another embodiment, some of the indicating blocks 1400B may be disposed to overlap with the edge line 10E of the cutting region 10C defining the package region 10P. The indicating blocks 1400B may be arrayed in at least two columns parallel with the edge line 10E, and the indicating blocks 1400B arrayed in each of the columns may be spaced apart from each other in a direction of the edge line 10E. For example, the indicating blocks 1400B may be arrayed in first to fifth columns 1401, 1402, 1403, 1404 and 1405 which are parallel with the edge line 10E or the cut side surface 1015S of the semiconductor package 20S. The first to fifth columns 1401, 1402, 1403, 1404 and 1405 may be sequentially arrayed from the edge line 10E of the cutting region 10C toward the semiconductor chip stack 200. In an embodiment, for example, the number of the indicating blocks 1400B exposed by a vertical section of the indicator 1400 parallel with the side surface 1015S (i.e., 1015S-1 or 1015S-2) of the semiconductor package 20S varies as the vertical section of the indicator 1400 becomes farther from the side surface 1015S of the semiconductor package 20S. In an embodiment, for example, the vertical section of the indicator 1400 parallel with the side surface 1015S of the semiconductor package 20S corresponding to a side surface 1015S-1 is greater than the vertical section corresponding to the side surface 1015S-2.

The number of the indicating blocks 1400B arrayed in each column may vary from the edge line 10E of the cutting region 10C toward the semiconductor chip stack 200. That is, the indicating blocks 1400B may be arrayed in the first to fifth columns 1401, 1402, 1403, 1404 and 1405 such that the number of the indicating blocks 1400B arrayed in the first column 1401, the number of the indicating blocks 1400B arrayed in the second column 1402, the number of the indicating blocks 1400B arrayed in the third column 1403, the number of the indicating blocks 1400B arrayed in the fourth column 1404, and the number of the indicating blocks 1400B arrayed in the fifth column 1405 are different from each other. The indicating blocks 1400B may be arrayed in the first to fifth columns 1401, 1402, 1403, 1404 and 1405 such that the number of the indicating blocks 1400B arrayed in each column may be gradually reduced from the edge line 10E of the cutting region 10C toward the semiconductor chip stack 200. For example, the number of the indicating blocks 1400B arrayed in the first column 1401 adjacent to the cutting region 10C may be five, and the number of the indicating blocks 1400B arrayed in the second column 1402 adjacent to the first column 1401 opposite to the cutting region 10C may be four. In addition, the number of the indicating blocks 1400B arrayed in the third column 1403 adjacent to the second column 1402 opposite to the first column 1401 may be three, and the number of the indicating blocks 1400B arrayed in the fourth column 1404 adjacent to the third column 1403 opposite to the second column 1402 may be two. Moreover, the number of the indicating blocks 1400B arrayed in the fifth column 1405 adjacent to the fourth column 1404 opposite to the third column 1403 may be one. An outline of the indicating blocks 1400B arrayed in the first to fifth columns 1401, 1402, 1403, 1404 and 1405 may exhibit a triangular shape in a plan view.

The indicating blocks 1400B arrayed in each column may be spaced apart from each other by a certain distance. The indicating blocks 1400B disposed in two adjacent columns among the first to fifth columns 1401, 1402, 1403, 1404 and 1405 may be arrayed in a zigzag fashion along a direction substantially parallel with the edge line 10E when viewed from a plan view. The indicating blocks 1400B may have the same width 1400D in a direction substantially perpendicular to the edge line 10E when viewed from a plan view. Each of the indicating blocks 1400B may have a rectangular shape in a plan view. The indicating blocks 1400B may have substantially the same size. Thus, the first to fifth columns 1401, 1402, 1403, 1404 and 1405 may have substantially the same width in a direction perpendicular to the edge line 10E when viewed from a plan view. Accordingly, a first distance B1 from the edge line 10E to an interface between the first and second columns 1401 and 1402 may be half a second distance B2 from the edge line 10E to an interface between the second and third columns 1402 and 1403 and may be one third a third distance B3 from the edge line 10E to an interface between the third and fourth columns 1403 and 1404. In addition, the first distance B1 from the edge line 10E to an interface between the first and second columns 1401 and 1402 may be one fourth a fourth distance B4 from the edge line 10E to an interface between the fourth and fifth columns 1404 and 1405 and may be one fifth a fifth distance B5 from the edge line 10E to an edge of the fifth column 1405 opposite to the fourth column 1404.

If only the cutting region 10C is accurately removed by the sawing process, the cut side surface 1015S of the semiconductor package 20S may be provided to overlap with the edge line 10E of the cutting region 10C. If a sawing position is shifted into the package region 10P by a process tolerance of a sawing machine during the sawing process, an edge portion of the package region 10P may be removed to expose the indicating blocks 1400B arrayed in any one of the first to fifth columns 1401, 1402, 1403, 1404 and 1405. In such a case, it may be possible to evaluate a distance (1300D of FIG. 12) between the cut side surface 1015S of the semiconductor package 20S and the semiconductor chip stack 200 using the number of the indicating blocks 1400B exposed at the cut side surface 1015S of the semiconductor package 20S.

Figure 14:
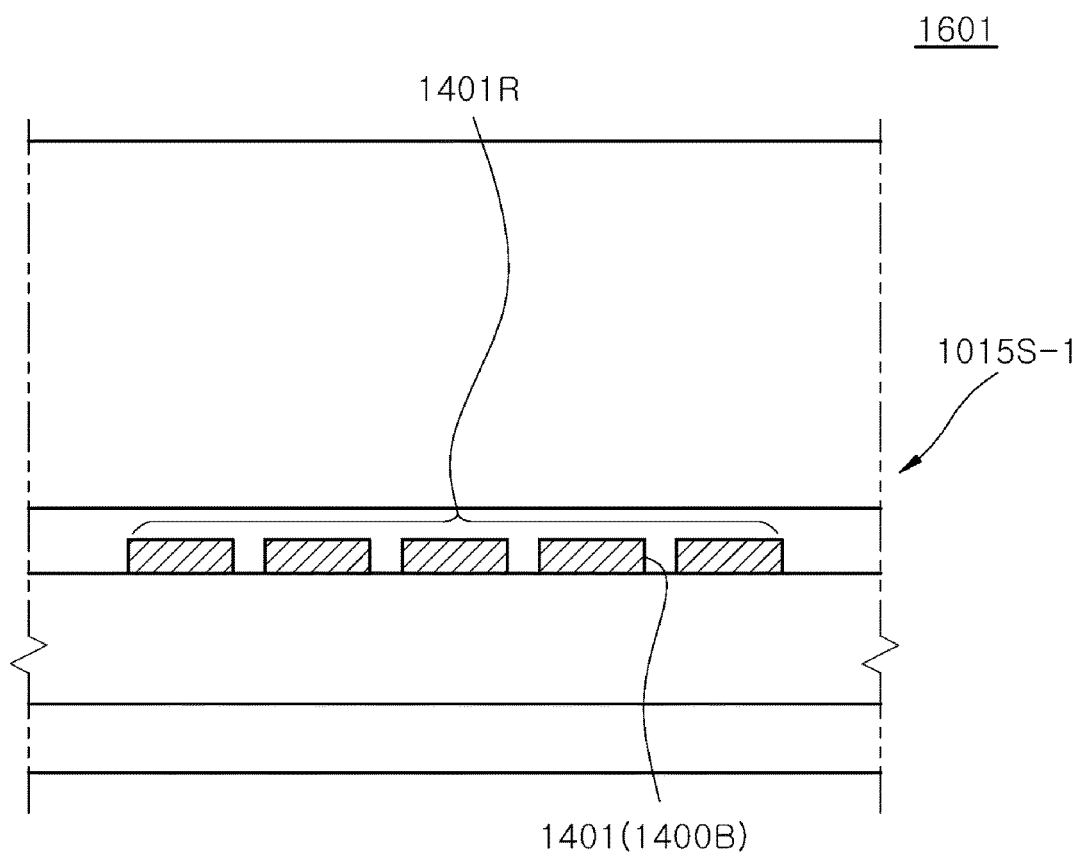
FIGS. 14 and 15 are cross-sectional views of the indicator shown in FIG. 13.
Figure 15:
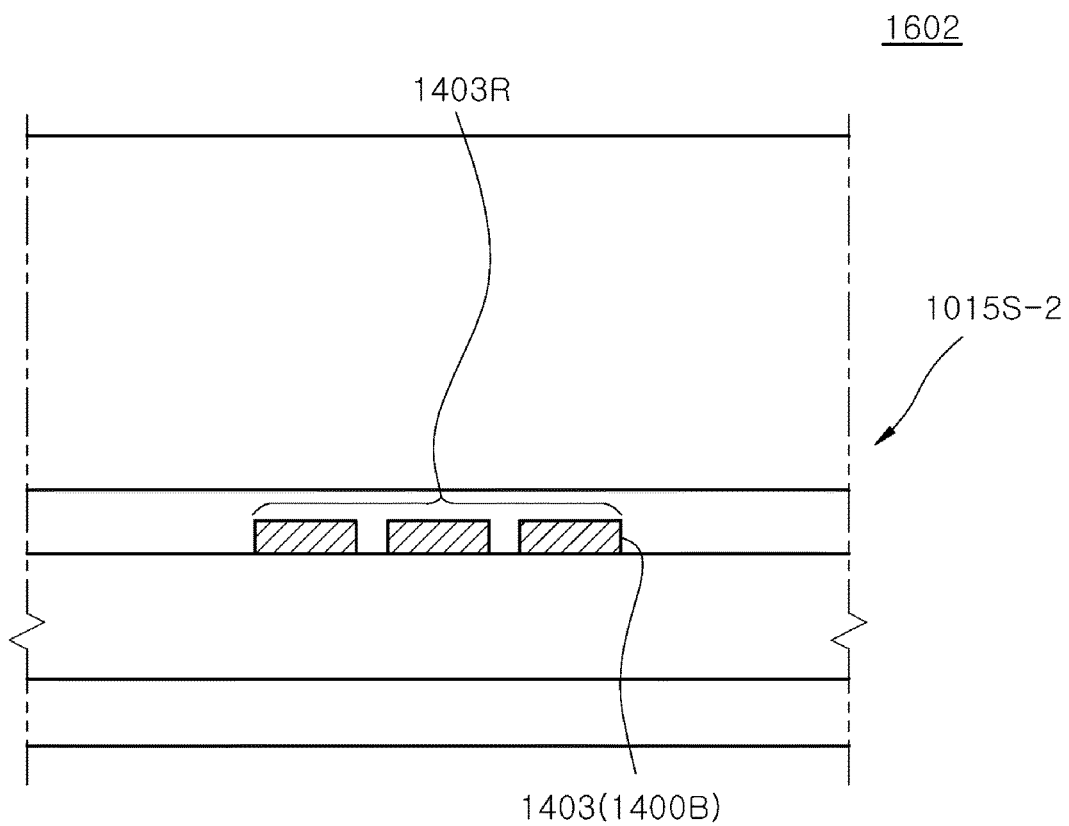

If the encapsulant (300 of FIG. 12) and the package substrate (100 of FIG. 12) are actually cut along a first sawing position 1601 during the sawing process, a cut side surface 1015S-1 of the semiconductor package 20S is illustrated in a cross-sectional view of FIG. 14. If the encapsulant (300 of FIG. 12) and the package substrate (100 of FIG. 12) are actually cut along a second sawing position 1602 during the sawing process, a cut side surface 1015S-2 of the semiconductor package 20S is illustrated in a cross-sectional view of FIG. 15. As illustrated in FIGS. 14 and 15, a cut side surface 1401R of the indicator 1400 cut along the first sawing position 1601 may be exposed to have a different feature from a cut side surface 1403R of the indicator 1400 cut along the second sawing position 1602.

An actual sawing position may be estimated by the cut side surface 1401R or 1403R of the indicator 1400. If the cut side surface 1401R or 1403R of the indicator 1400 is exposed at the cut side surface 1015S-1 or 1015S-2 of the semiconductor package 20S, it may be understood that the actual sawing position is located in the first column 1401 or the third column 1403.

Referring to FIG. 14, since the number of the exposed indicating blocks 1400B is five, it may be understood that the actual sawing position (i.e., the first sawing position 1601) is located in the first column 1401. In such a case, it may be understood that the actual side surface 1015S-1 of the semiconductor package 20S is shifted from the ideally designed side surface 1015S toward the semiconductor chip stack 200 by a distance less than the width 1400D of the indicating blocks 1400B. Thus, it may be possible to extract a range of a distance 1300D-1 between the actual side surface 1015S-1 and the semiconductor chip stack 200.

Referring to FIG. 15, since the number of the exposed indicating blocks 1400B is three, it may be understood that the actual sawing position (i.e., the second sawing position 1602) is located in the third column 1403. In such a case, it may be understood that the actual side surface 1015S-2 of the semiconductor package 20S is shifted from the ideally designed side surface 1015S toward the semiconductor chip stack 200 by a distance which is greater than twice the width 1400D of the indicating blocks 1400B and is less than three times the width 1400D of the indicating blocks 1400B. Thus, it may be possible to extract a range of a distance 1300D-2 between the actual side surface 1015S-2 and the semiconductor chip stack 200.

FIG. 13 illustrates an embodiment in which the number of the indicating blocks 1400B arrayed in each column is gradually reduced from the edge line 10E of the cutting region 10C toward the semiconductor chip stack 200. However, in some other embodiments, the indicator 1400 may be designed such that the number of the indicating blocks 1400B arrayed in each column gradually increases from the edge line 10E of the cutting region 10C toward the semiconductor chip stack 200.

Figure 16:
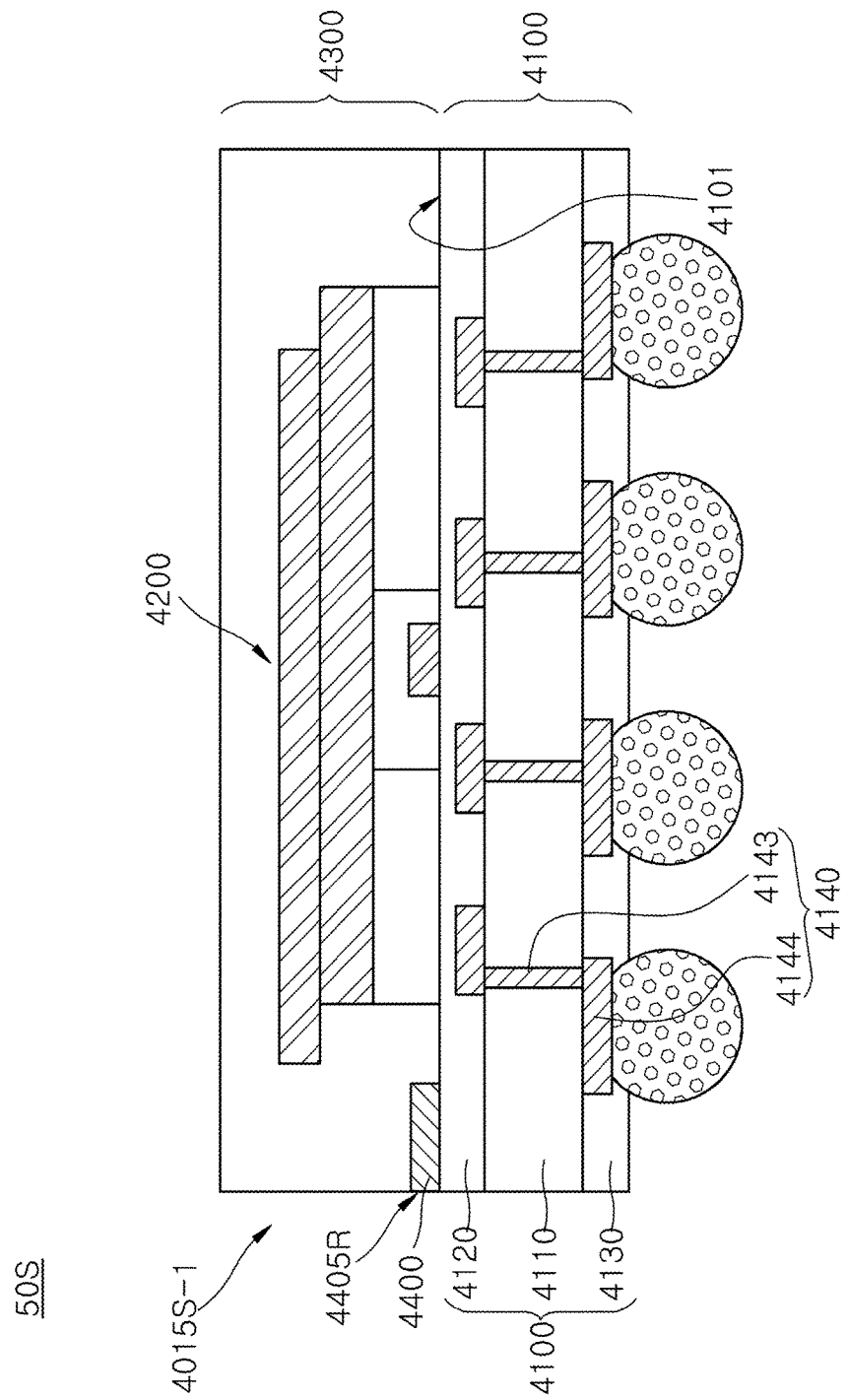
FIG. 16 is a cross-sectional view illustrating a semiconductor package according to yet another embodiment.

FIG. 16 is a cross-sectional view illustrating a semiconductor package 50S according to other embodiments.

Referring to FIG. 16, the semiconductor package 50S may include a package substrate 4100 and a semiconductor chip stack 4200 and an encapsulant 4300 which are disposed on the package substrate 4100. The semiconductor package 50S may further include an indicator 4400 having a cut side surface 4405R which is exposed at a cut side surface 4015S-1 of the semiconductor package 50S. The indicator 4400 may be designed to have the same shape as any one of the indicators described with reference to FIGS. 1 to 15. While the indicator 400 illustrated in FIG. 1 is located at the same level as the first interconnection patterns 142 disposed between the body layer 110 and the first dielectric layer 120 of the package substrate 100, the indicator 4400 illustrated in FIG. 16 may be disposed on a first surface 4101 of the package substrate 4100. That is, the indicator 4400 may be disposed between the package substrate 4100 and the encapsulant 4300. However, the indicator 4400 may be disposed at any other position if the cut side surface 4405R of the indicator 4400 can be exposed at the cut side surface 4015S-1 of the semiconductor package 50S. The package substrate 4100 may include a body layer 4110, a first dielectric layer 4120 disposed on a first surface of the body layer 4110, and a second dielectric layer 4130 disposed on a second surface of the body layer 4110 opposite to the first dielectric layer 4120. The indicator 4400 may be formed of a material which is distinguished from the encapsulant 4300, the body layer 4110, the first dielectric layer 4120 and the second dielectric layer 4130. The package substrate 4100 may further include an interconnection structure 4140 therein. The interconnection structure 4140 of FIG. 16 may include a first interconnection pattern 4142, a second interconnection pattern 4144, and an internal interconnection pattern 4143 similar to the interconnection structure 140 of FIG. 1. The interconnection structure 4140 may be formed of a conductive layer, for example, a copper layer. The indicator 4400 may be formed of the same material as the interconnection structure 4140. While the indicator 400 and the first interconnection patterns 142 illustrated in FIG. 1 are simultaneously formed by patterning a conductive layer, the indicator 4400 may be formed at a different process step from a process step for forming first interconnection patterns 4142 of the interconnection structure 4140. In an embodiment, the indicator 1400 may be located at the same level as the interconnection structure 4140. In an embodiment, the indicator 1400 may be located at the same level as the first interconnection pattern 4142. In an embodiment, the indicator 1400 may be located at the same level as the second interconnection pattern 4144. In an embodiment, the indicator 1400 may be located at the same level as the internal interconnection pattern 4143. In an embodiment, for example, the indicator 1400 may be located at the same level or levels as all or less than all of the interconnection patterns of the interconnection structure 4140. In an embodiment, for example, the columns of the indicator 1400 may be located at the same or different levels of the interconnection patterns of the interconnection structure 4140.

Figure 17:
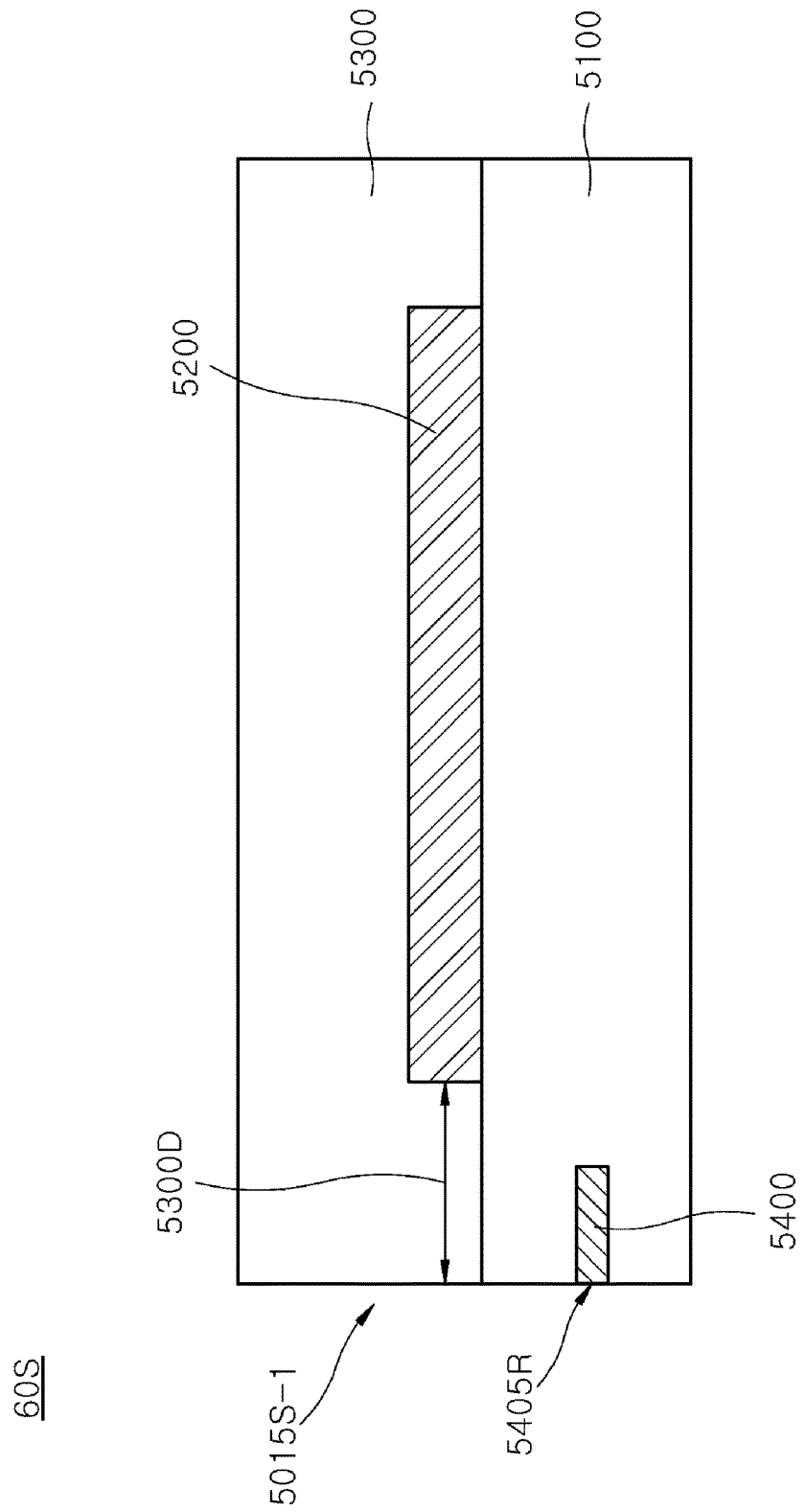
FIG. 17 is a cross-sectional view illustrating a semiconductor package according to still another embodiment.

FIG. 17 is a cross-sectional view illustrating a semiconductor package 60S according to other embodiments.

Referring to FIG. 17, the semiconductor package 60S may include a package substrate 5100 and a semiconductor chip 5200 and an encapsulant 5300 which are disposed on the package substrate 5100. The semiconductor package 60S may further include an indicator 5400 having a cut side surface 5405R which is exposed at a cut side surface 5015S-1 of the semiconductor package 60S. The indicator 5400 may be designed to have the same shape as any one of the indicators described with reference to FIGS. 1 to 15. If the single semiconductor chip 5200 is disposed on the package substrate 5100, a size of the semiconductor package 60S may be reduced as compared with the semiconductor package 10S, 20S or 50S including the plurality of semiconductor chips which are stacked. In such a case, a distance 5300D between the cut side surface 5015S-1 and the semiconductor chip 5200 may also be reduced. Thus, the indicator 5400 may be more effectively used to evaluate the distance 5300D between the cut side surface 5015S-1 and the semiconductor chip 5200.

Figure 18:
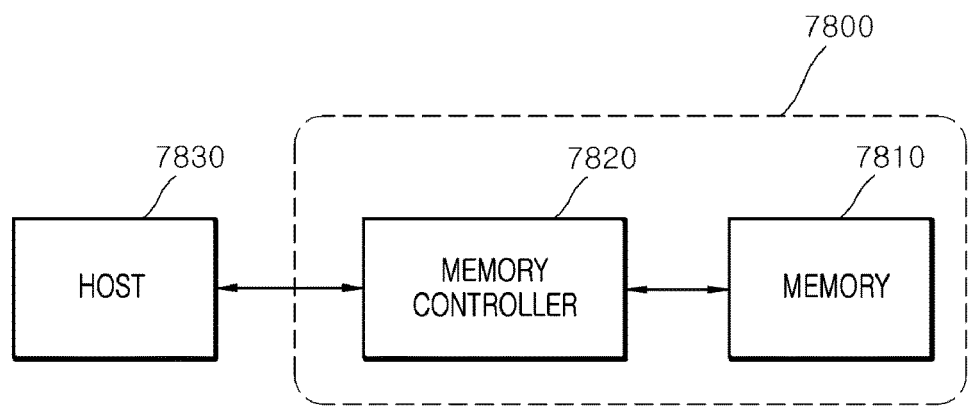
FIG. 18 is a block diagram illustrating an electronic system employing a memory card including at least one of semiconductor packages according to some embodiments.

FIG. 18 is a block diagram illustrating an electronic system including a memory card 7800 employing at least one of the semiconductor packages according to the embodiments. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include at least one of the semiconductor packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 19:
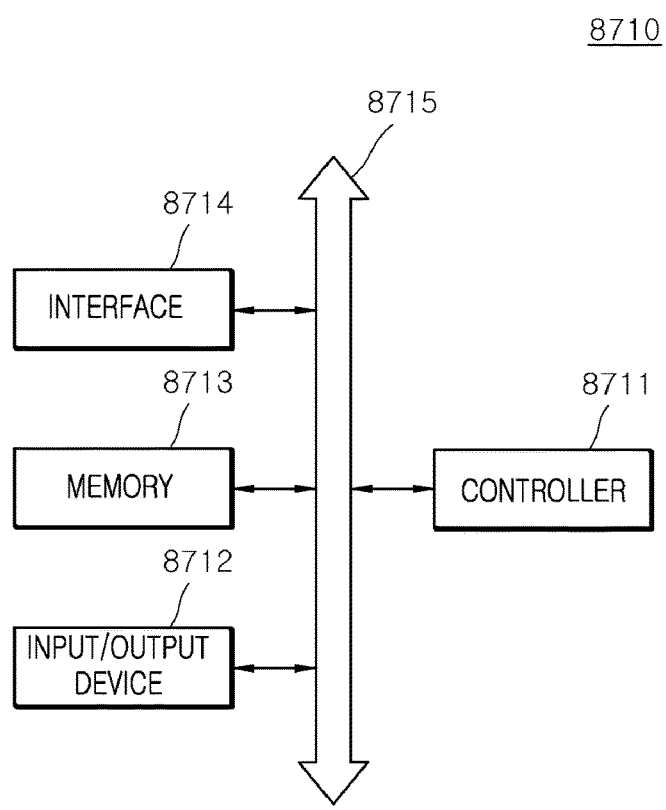
FIG. 19 is a block diagram illustrating another electronic system including at least one of semiconductor packages according to some embodiments.

FIG. 19 is a block diagram illustrating an electronic system 8710 including at least one of the packages according to the embodiments. The electronic system 8710 may include a controller 8711, an input/output device 8712 and a memory 8713. The controller 8711, the input/output device 8712 and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) or Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor package comprising:
    a package substrate to which a first semiconductor chip is attached;
    an encapsulant covering the first semiconductor chip; and
    an indicator including an array of indicating blocks disposed within the semiconductor package,
    wherein at least one of the indicating blocks is exposed at a side surface of the semiconductor package, and
    wherein the number of the indicating blocks exposed by a vertical section of the indicator parallel with the side surface of the semiconductor package varies as the vertical section of the indicator becomes farther from the side surface of the semiconductor package.

2. The semiconductor package of claim 1, wherein the indicator is disposed in the package substrate.

3. The semiconductor package of claim 1, wherein the indicator is disposed on the package substrate.

4. The semiconductor package of claim 1, wherein the indicating blocks are arrayed in a plurality of columns which are sequentially disposed from the side surface of the semiconductor package toward the first semiconductor chip.

5. The semiconductor package of claim 4, wherein the indicating blocks disposed in two adjacent columns among the plurality of columns are arrayed in a zigzag fashion along a length direction of the plurality of columns.

6. The semiconductor package of claim 4, wherein the indicating blocks arrayed in each of the plurality of columns are spaced apart from each other by substantially the same distance.

7. The semiconductor package of claim 1,
    wherein each of the indicating blocks includes a rectangular pattern; and
    wherein the indicating blocks are substantially the same size.

8. The semiconductor package of claim 1,
    wherein the indicating blocks are arrayed in first to third columns which are sequentially disposed from the side surface of the semiconductor package toward the first semiconductor chip; and
    wherein the number of the indicating blocks arrayed in the first column, the number of the indicating blocks arrayed in the second column, and the number of the indicating blocks arrayed in the third column are different from each other.

9. The semiconductor package of claim 1, wherein the number of the indicating blocks which are exposed at the side surface of the semiconductor package varies according a distance between the side surface of the semiconductor package and the first semiconductor chip.

10. The semiconductor package of claim 1, wherein the indicating blocks are disposed between the encapsulant and the package substrate.

11. The semiconductor package of claim 1,
    wherein the package substrate includes interconnection patterns; and
    wherein the indicating blocks are located at the same level as the interconnection structure.

12. The semiconductor package of claim 1, further comprising a second semiconductor chip which is stacked on the first semiconductor chip and is offset from the first semiconductor chip.

13. The semiconductor package of claim 1, further comprising:
    an additional semiconductor chip disposed between the first semiconductor chip and the package substrate; and
    a supporting part disposed between the first semiconductor chip and the package substrate to support the first semiconductor chip and to provide a cavity in which the additional semiconductor chip is disposed.

* * * * *